United States Patent
Lidar et al.

(10) Patent No.: US 7,307,275 B2
(45) Date of Patent: Dec. 11, 2007

(54) ENCODING AND ERROR SUPPRESSION FOR SUPERCONDUCTING QUANTUM COMPUTERS

(75) Inventors: Daniel Lidar, Toronto (CA); Lian-Ao Wu, Toronto (CA); Alexandre Blais, Sherbrooke (CA)

(73) Assignees: D-Wave Systems Inc., Burnaby (CA); The University of Toronto, Toronto (CA)

( * ) Notice: Subject to any disclaimer, the term of this patent is extended or adjusted under 35 U.S.C. 154(b) by 422 days.

(21) Appl. No.: 10/407,683

(22) Filed: Apr. 4, 2003

(65) Prior Publication Data

US 2004/0000666 A1    Jan. 1, 2004

Related U.S. Application Data

(60) Provisional application No. 60/370,087, filed on Apr. 4, 2002.

(51) Int. Cl.
*H01L 21/00* (2006.01)
*H01L 29/06* (2006.01)

(52) U.S. Cl. .......................... 257/31; 257/34; 257/36; 257/39; 257/E39.016; 257/E39.019; 257/E39.02

(58) Field of Classification Search .................. 257/31, 257/34, 36, 39
See application file for complete search history.

(56) References Cited

U.S. PATENT DOCUMENTS

| | | | | |
|---|---|---|---|---|
| 5,768,297 A | * | 6/1998 | Shor | .......................... 714/763 |
| 5,917,322 A | * | 6/1999 | Gershenfeld et al. | ....... 324/307 |
| 6,317,766 B1 | | 11/2001 | Grover | |
| 6,456,994 B1 | * | 9/2002 | Tucci | .......................... 706/52 |
| 6,459,097 B1 | | 10/2002 | Zagoskin | |
| 6,504,172 B2 | | 1/2003 | Zagoskin et al. | |
| 6,563,310 B2 | * | 5/2003 | Zagoskin | ..................... 324/248 |
| 6,614,047 B2 | | 9/2003 | Tzalenchuk et al. | |
| 6,800,837 B1 | * | 10/2004 | Ichimura et al. | ........ 250/214 R |
| 2002/0106084 A1 | * | 8/2002 | Azuma et al. | .............. 380/263 |

(Continued)

OTHER PUBLICATIONS

Aharonov, D., and M. Ben-Or, 1996, "Fault Tolerant Quantum Computation with Constant Error," ArXiv.org preprint server: quant-ph/9611025.

(Continued)

*Primary Examiner*—Sue A. Purvis
*Assistant Examiner*—Fazli Erdem
(74) *Attorney, Agent, or Firm*—Seed IP Law Group PLLC

(57) ABSTRACT

The present invention involves a quantum computing structure, comprising: one or more logical qubits, which is encoded into a plurality of superconducting qubits; and each of the logical qubits comprises at least one operating qubit and at least one ancilla qubit. Also provided is a method of quantum computing, comprising: performing encoded quantum computing operations with logical qubits that are encoded into superconducting operating qubits and superconducting ancilla qubits. The present invention further involves a method of error correction for a quantum computing structure comprising: presenting a plurality of logical qubits, each of which comprises an operating physical qubit and an ancilla physical qubit, wherein the logical states of the plurality of logical qubits are formed from a tensor product of the states of the operating and ancilla qubits; and wherein the states of the ancilla physical qubits are suppressed; and applying strong pulses to the grouping of logical qubits.

47 Claims, 14 Drawing Sheets

U.S. PATENT DOCUMENTS

| | | | |
|---|---|---|---|
| 2002/0117655 | A1 | 8/2002 | Amin et al. |
| 2002/0117656 | A1* | 8/2002 | Amin et al. ............... 257/9 |
| 2002/0121636 | A1* | 9/2002 | Amin et al. ............... 257/9 |
| 2002/0188578 | A1 | 12/2002 | Amin et al. |
| 2003/0023651 | A1 | 1/2003 | Whaley et al. |
| 2003/0055513 | A1* | 3/2003 | Raussendorf et al. ......... 700/1 |
| 2004/0077503 | A1 | 4/2004 | Blais et al. |
| 2004/0119061 | A1 | 6/2004 | Wu et al. |

OTHER PUBLICATIONS

Bacon, D., J. Kempe, D.A. Lidar, and K.B. Whaley, 2000, "Universal Fault-Tolerant Quantum Computation on Decoherence-Free Subspaces," Phys. Rev. Lett. 85, pp. 1758-1761.

Bacon, D., J. Kempe, D.P. DiVincenzo, D.A. Lidar, and K.B. Whaley, 2001, "Encoded Universality in Physical Implementations of a Quantum Computer," ArXiv.org preprint server: quant-ph/0102140.

Barenco, A., C.H.Bennett, R. Cleve, D.P. DiVincenzo, N. Margolus, P. Shor, T. Sleator, J. Smolin, and H. Weinfurter, 1995, "Elementary gates for quantum computation," Phys. Rev. A 52, pp. 3457-3467.

Benjamin, S.C., 2001, "Simple pulses for universal quantum computation with a Heisenberg ABAB chain," Phys. Rev. A 64, 054303.

Blais, A., and A.M. Zagoskin, 2000, "Operation of universal gates in a solid-state quantum computer based on clean Josephson junctions between d-wave superconductors," Phys. Rev. A 61, 042308.

Blatter, G., V.B. Geshkenbein, and L.V. Ioffe, 2001, "Design aspects of superconducting-phase quantum bits," Phys. Rev. B 63, 174511.

Boykin, P.O., T. Mor, M. Pulver, V. Roychowdhury, and F. Vatan, 1999, "On Universal and Fault-Tolerant Quantum Computing," ArXiv.org preprint server: quant-ph/9906054, last accessed on Jul. 15, 2004.

Byrd, M.S., and D.A. Lidar, 2001, "Bang-Bang operations from a geometric perspective," ArXiv.org preprint server: quant-ph/0110121.

Byrd, M.S., and D.A. Lidar, 2001, "Combined encoding, recoupling, and decoupling solution to problems of decoherence and design in solid-state quantum computing," ArXiv.org preprint server: quant-ph/0112054.

DiVincenzo, D.P., 2000, "The Physical Implementation of Quantum Computation", ArXiv.org preprint server: quant-ph/0002077.

DiVincenzo, D.P., D.Bacon, J.Kempe, G.Burkard, and K.B. Whaley, 2000, "Universal quantum computation with the exchange interaction," Nature 408, pp. 339-342.

Duan, L.-M., and G. Guo, 1999, "Pulse controlled noise suppressed quantum computation," ArXiv.org preprint server: quant-ph/9807072.

Il'ichev, E., M. Grajcar, R. Hlubina, R.P.J. IJsselsteijn, H.E. Hoenig, H.-G. Meyer, A. Golubov, M.H.S. Amin, A.M. Zagoskin, A.N. Omelyanchouk, and M.Yu. Kupriyanov, 2001, "Degenerate Ground State in a Mesoscopic $YBa_2Cu_3O_{7-x}$ Grain Boundary Josephson Junction", Phys. Rev. Lett. 86, pp. 5369-5372.

Kempe, J., D. Bacon, D.P. DiVincenzo, and K.B. Whaley, 2001, "Encoded universality from a single physical interaction," ArXiv.org preprint server: quant-ph/0112013.

Kempe, J., D. Bacon, D.A. Lidar, and K.B. Whaley, 2001, "Theory of decoherence-free fault-tolerant universal quantum computation," Phys. Rev. A 63, 042307.

Kempe, J., and K.B. Whaley, 2001,"Exact gate-sequences for universal quantum computation using the XY-interaction alone,"ArXiv.org preprint server: quant-ph/0112014.

Knill, E., R. Laflamme, and W. Zurek, 1998, "Resilient Quantum Computation," Science pp. 279, pp. 342-345.

Leung, D.W., I.L. Chuang, F. Yamaguchi, and Y. Yamamoto, 2000, "Efficient implementation of coupled logic gates for quantum computation," Phys. Rev. A 61, 042310.

Levy, J., 2001, "Universal quantum computation with spin-1/2 pairs and Heisenberg exchange," ArXiv.org preprint server: quant-ph/0101057.

Lidar, D.A., D.Bacon, J. Kempe, and K.B. Whaley, 2001, "Decoherence-free subspaces for multiple-qubit errors. II. Universal, fault-tolerant quantum computation," Phys. Rev. A 63, 022307.

Lidar, D.A., I.L. Chuang, and K.B. Whaley, 1998, "Decoherence-Free Subspaces for Quantum Computation," Phys. Rev. Lett. 81, pp. 2594-2597.

Lidar, D.A., and L.-A. Wu, 2002, "Reducing Constraints on Quantum Computer Design by Encoded Selective Recoupling," Phys. Rev. Lett. 88, 017905.

Makhlin, Y., G.Schön, and A. Shnirman, 2001, "Quantum-state engineering with Josephson-junction devices," Rev. Mod. Phys. 73, pp. 357-401.

Mooij, J.E., T.P. Orlando, L. Levitov, L. Tian, C.H. van der Wal, and S. Lloyd, 1999, "Josephson persistent-current qubit", Science, vol. 285, pp. 1036-1039.

Nicoletti, S., H. Moriceau, J.C. Villegier, D. Chateigner, B. Bourgeaux, C. Cabanel and J.Y. Laval, 1996, "Bi-epitaxial YBCO grain boundary Josephson junctions on $SrTiO_3$ and sapphire substrates," Physica C 269, pp. 255-267.

Orlando, T.P, J.E. Mooij, L.Tian, C.H. van der Wal, L.S. Levitov, S.Lloyd, and J.J.Mazo, 1999, "Superconducting persistent-current qubit,"Phys. Rev. B 60, 15398.

Protopopescu, V., R. Perez, C.D 'Helon, and J.Schmulen, 2002, "Robust control of decoherence in realistic quantum gates," ArXiv.org preprint server: quant-ph/0202141.

Steane, A.M., 1999, "Efficient fault-tolerant quantum computing," ArXiv.org preprint server: quant-ph/9809054.

Tafuri, F.F., F. Carillo, F. Lombardi, F. Miletto Granozio, F. Ricci, U. Scotti di Uccio, A. Barone, G. Testa and E. Sarnelli and J.R. Kirtley, 2000, "Feasibility of biepitaxial $YBa_2Cu_3O_{7-x}$ Josephson junctions for fundamental studies and potential circuit implementation," Phys. Rev. B 62, pp. 14431-14438.

Vala, J., and K.B. Whaley, 2002, "Encoded universality for generalized anisotropic exchange Hamiltonians," ArXiv.org preprint server: quant-ph/0204016.

Viola, L., 2001, "On quantum control via encoded dynamical decoupling," ArXiv.org preprint server: quant-ph/0111167.

Viola, L., E. Knill, and S. Lloyd, 1999, "Dynamical Decoupling of Open Quantum Systems," Phys. Rev. Lett. 82, pp. 2417-2421.

Viola, L., E. Knill, and S. Lloyd, 1999, "Universal Control of Decoupled Quantum Systems," Phys. Rev. Lett. 83, pp. 4888-4891.

Viola, L., E. Knill, and S. Lloyd, 2000, "Dynamical Generation of Noiseless Quantum Subsystems," Phys. Rev. Lett. 85, pp. 3520-3523.

Viola, L., and S. Lloyd, 1998, "Dynamical suppression of decoherence in two-state quantum systems," Phys. Rev. A 58, pp. 2733-2744.

Vitali, D., and P. Tombesi, 1999, "Using parity kicks for decoherence control," Phys. Rev. A 59, pp. 4178-4186 (1999).

Vitali, D., and P. Tombesi, 2002, "Heating and decoherence suppression using decoupling techniques," Phys. Rev. A 65, 012305.

Wu, L.-A., and D.A. Lidar, 2002, "Power of anisotropic exchange interactions: Universality and efficient codes for quantum computing," Phys. Rev. A 65, 042318.

Wu, L.-A., and D.A. Lidar, 2002, "Universal quantum logic from Zeeman and anisotropic exchange interactions," ArXiv.org preprint server: quant-ph/0202135.

Wu, L.-A., M.S. Byrd, and D.A. Lidar, 2002, "Efficient universal leakage elimination for physical and encoded qubits," ArXiv.org preprint server: quant-ph/0202168.

Zanardi, P., 1999, "Symmetrizing Evolutions," ArXiv.org preprint server: quant-ph/9809064.

Zanardi, P., and M. Rasetti, 1997, "Noiseless Quantum Codes," Phys. Rev. Lett. 79, pp. 3306-3309.

Inokuchi, T. et al., "Analog Computation using Quantum-Flux Parametron Devices," Physica C, 357-360, pp. 1618-1621, Department of Electrical Engineering, Hokkaido University, Kita 13, Nishi 8, Sapporo 060-8628, Japan, Jan. 12, 2001.

* cited by examiner

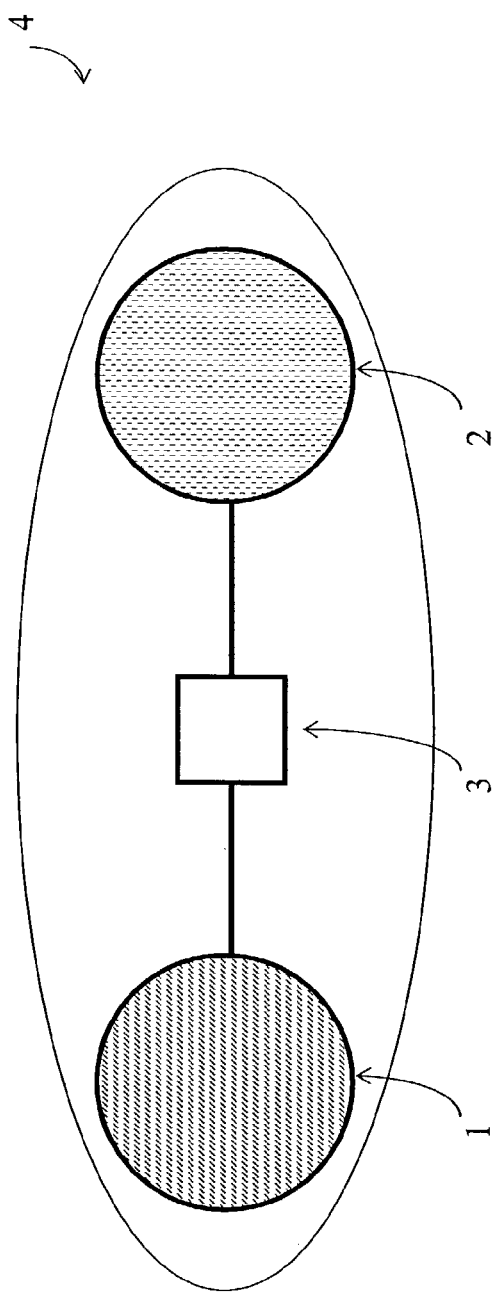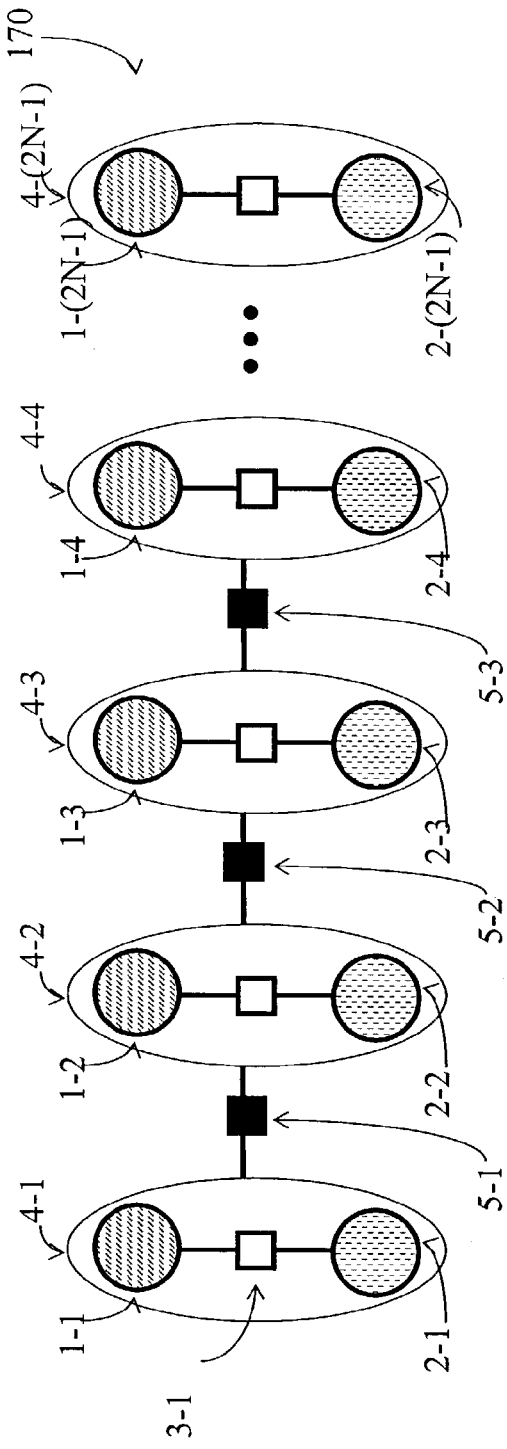

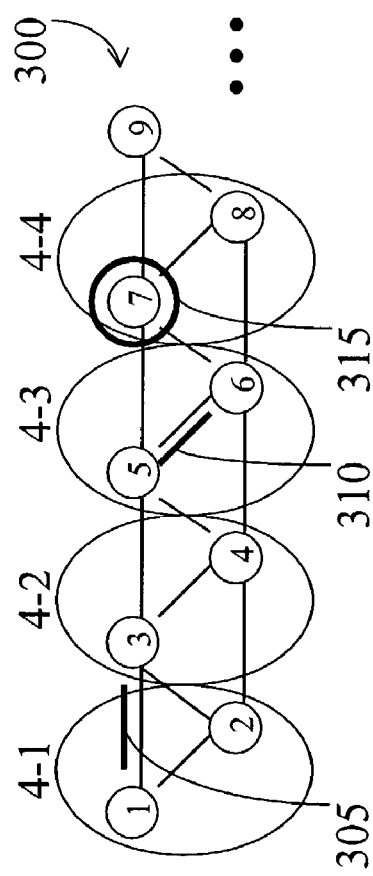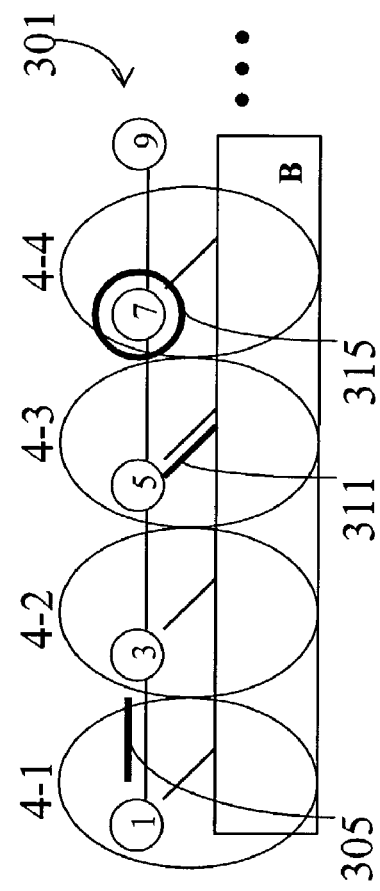
FIG. 3A
FIG. 3B

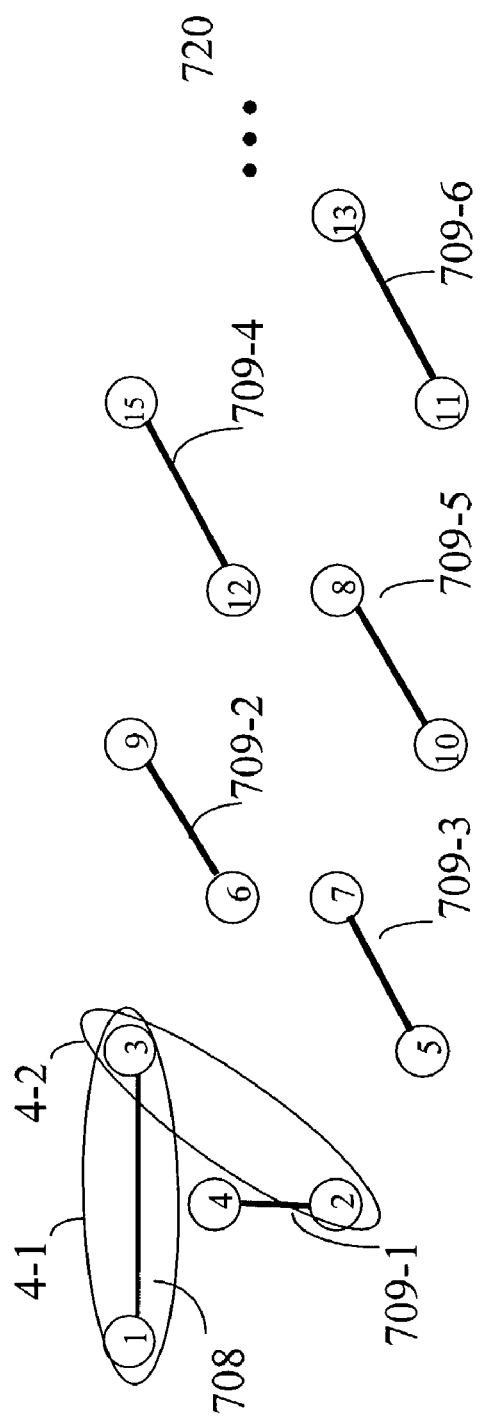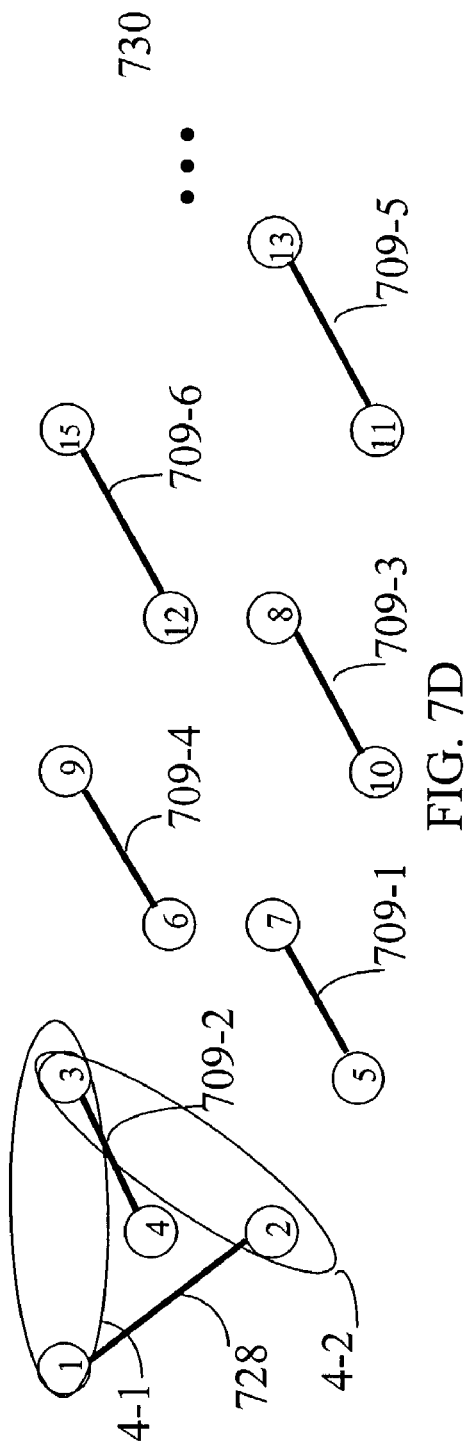

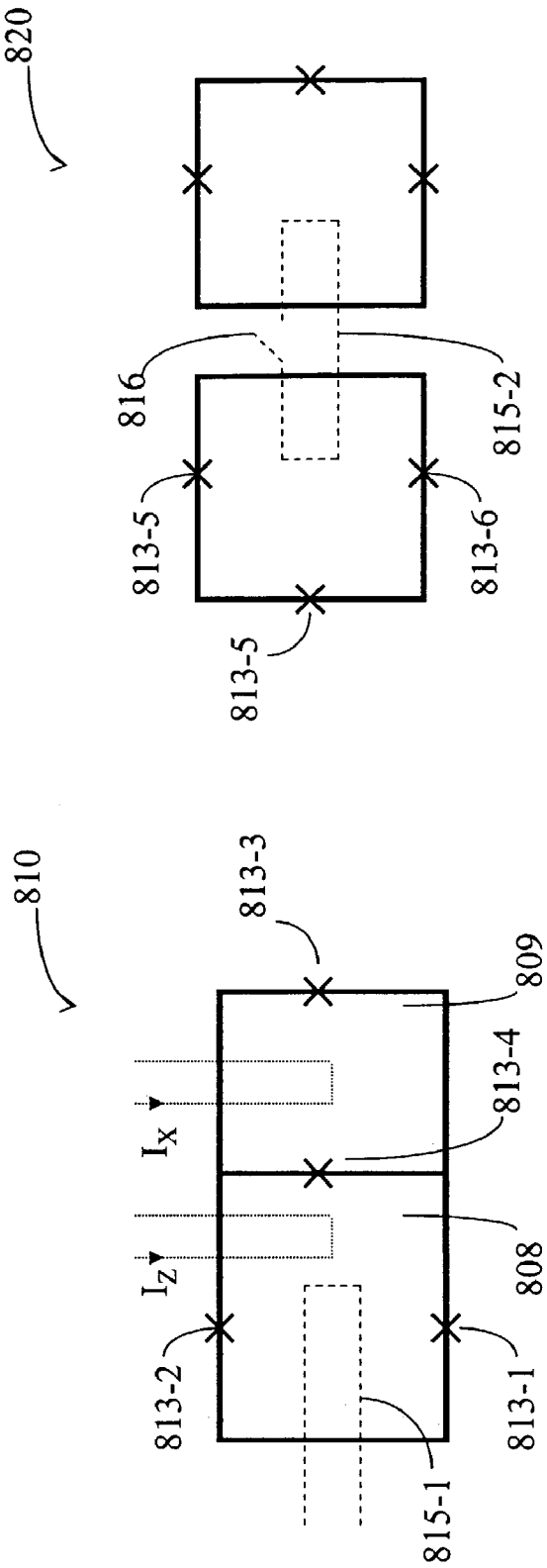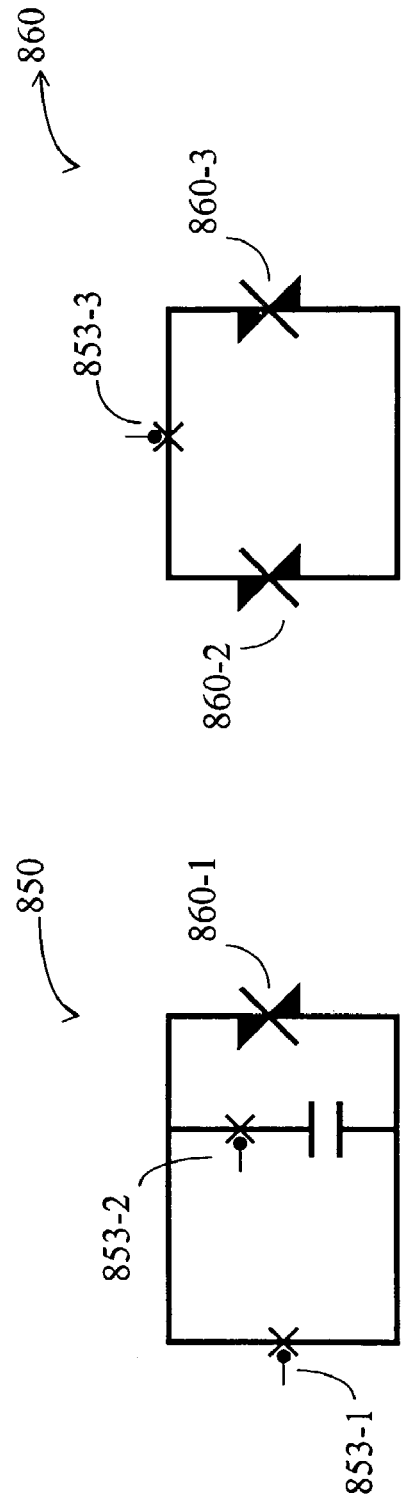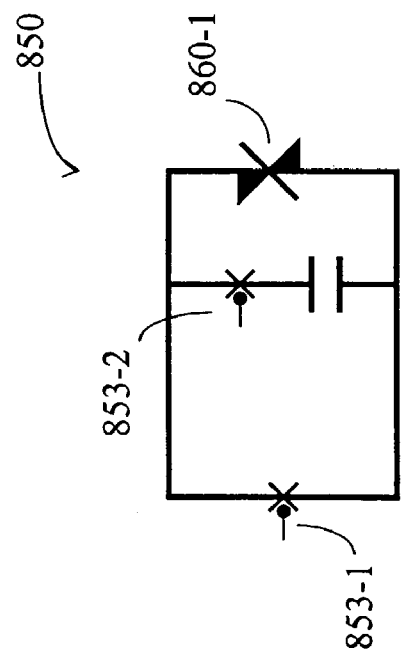

ENCODING AND ERROR SUPPRESSION FOR SUPERCONDUCTING QUANTUM COMPUTERS

CROSS-REFERENCE TO RELATED APPLICATIONS

This application claims priority to provisional U.S. application Ser. No. 60/370,087, filed on Apr. 4, 2002, entitled "Encoding And Error Suppression For Superconducting Quantum Computers", which is incorporated herein by reference in its entirety.

The instant application is related to the following applications: U.S. Pat. No. 6,459,097 B1 entitled "Qubit using a Josephson Junction between s-Wave and d-Wave Superconductors," to Zagoskin; U.S. Pat. No. 6,504,172 B2 entitled "Superconducting Dot/Anti-Dot Flux Qubit Based On Time Reversal Symmetry Breaking Effects," to Zagoskin et al; application Ser. No. 09/839,637 entitled "Quantum Bit with a Multi-Terminal Junction and Loop with a Phase Shift," filed Apr. 20, 2001; application Ser. No. 09/872,495 entitled "Quantum Processing System and Method for a Superconducting Phase Qubit," filed Jun. 1, 2001; application Ser. No. 10/025,848 entitled "Finger Squid Qubit Device," filed Dec. 17, 2001, each application incorporated herein by reference in their entirety.

FIELD OF THE INVENTION

The present invention relates to methods and apparatus for performing quantum information processing, storage, and communication. Specifically, the present invention relates to universal quantum computing with superconducting quantum computers.

BACKGROUND

The present invention is broadly applicable in the rapidly developing field of quantum computing. Research in the field of quantum computing began in 1982 when physicist Richard Feynman introduced the concept of a "quantum simulator." See R. P. Feynman, "Simulating Physics with Computers", *Int. J. Theor. Phys.*, 21:467-488 (1982). Feynman noted that quantum systems are inherently difficult to simulate with conventional computers but that observing the evolution of an analogous quantum system could provide an exponentially faster way to solve the mathematical model of a system. In particular, solving a model for the behavior of a quantum system commonly involves solving a differential equation related to the Hamiltonian of the quantum system. Soon it was determined that a quantum system could be used to yield a potentially exponential time saving in certain types of intensive computations. See D. Deutsch, "Quantum Theory, the Church-Turing Principle and the Universal Quantum Computer", *Proc. of the Roy. Soc. of London* A400:97-117 (1985).

Since then, research has progressed to include significant software and hardware advances. As the speed of classical computers approaches a projected upper bound due to the natural limits of miniaturization of integrated circuits, so interest in quantum computers has intensified. Indeed, many algorithms have been written to run on quantum computers, two notable examples being the Shor and Grover algorithms. See P. Shor, "Polynomial-time Algorithms for Prime Factorization and Discrete Logarithms on a Quantum Computer", *SIAM J. of Comput.*, 26(5): 1484-1509 (1997), and U.S. Pat. No. 6,317,766 entitled "Fast Quantum Mechanical Algorithms"; and L. Grover, "A Fast Quantum Mechanical Algorithm for Database Search", *Proc.* 28*th STOC*, 212-219 (1996). It has further been shown that preventive error correction schemes for quantum computing are theoretically possible. See U.S. Pat. No. 5,768,297, entitled: "Method for reducing decoherence in quantum computer memory" to P. W. Shor; and U.S. Pat. No. 6,128,764, entitled: "Quantum error-correcting codes and devices", to D. Gottesman.

Furthermore, methods of operating quantum computers have been described. See, for example, in U.S. Pat. No. 6,301,029, entitled: "Method and apparatus for configuring quantum mechanical state, and communication method and apparatus using the same", to H. Azuma, and in U.S. Pat. No. 6,317,766, entitled: "Fast quantum mechanical algorithms", to L. Grover. These high level algorithms have relevance to proposals for solid state implementations.

Thus, the quantum computer is now rapidly evolving from a wholly theoretical idea to a physical device that will have a profound impact on the computing of tomorrow. A quantum computer differs principally from a conventional, semiconductor chip-based computer, in that the basic element of storage is a "quantum bit", or "qubit". Generally speaking, a qubit is a well-defined physical structure that has a plurality of quantum states, that can be isolated from its environment and that can evolve in a quantum mechanical fashion. A survey of the current physical systems from which qubits could be formed can be found in: S. L. Braunstein and H. K. Lo (eds.), *Scalable Quantum Computers*, Wiley-VCH Verlag GmbH, Berlin (2001), incorporated herein by reference. A qubit is a creature of the quantum world: it can exist in a superposition of two states and can thereby hold more information than the binary bit that underpins conventional computing. One of the principal challenges in quantum computing is to establish an array of controllable qubits, so that large scale computing operations can be carried out.

Although a number of different types of qubits have been created, it is believed that the practical realization of a large scale quantum computer is most likely to be achieved by harnessing the properties of superconducting junctions. It is in the superconducting regime that many materials display their underlying quantum behavior macroscopically, thereby offering the chance for manipulation of quantum states in a measurable way. For example, a superconducting qubit and register, i.e., an array of interacting qubits, has been described in U.S. Pat. No. 6,459,097 B1 entitled "Qubit using a Josephson Junction between s-Wave and d-Wave Superconductors," to Zagoskin. The field has been reviewed, for example, by Y. Makhlin, G. Schön, and A. Shnirman in "Quantum-State Engineering with Josephson-Junction Devices", *Reviews of Modern Physics*, Vol. 73, pp. 357-400 (2001).

The early theoretical work in the field of quantum computing led to the creation of a formal theory of the nominal capabilities that are held to be necessary conditions for a physical system to behave as a qubit, and for a series of qubits to become a quantum computer. See D. DiVincenzo in *Scalable Quantum Computers*, S. L. Braunstein and H. K. Lo (eds.), chapter 1, Wiley-VCH Verlag GmbH, Berlin (2001), also published as ArXiv preprint "quant-ph/0002077" (2000), incorporated herein by reference. These requirements include the need for the system to be scalable, i.e., the ability of the system to combine a reasonable number of qubits. Associated with scalability is the need to eliminate decoherence in a qubit. Also required for a qubit to be useful in quantum computing is the ability to perform operations that initialize, control and couple qubits. Control of a qubit includes performing single qubit operations as well as operations on. two or more qubits. Coupling is an operation performed on two or more qubits. Finally, it is necessary to be able to measure the state of a qubit in order to perform computing operations.

To make a practical design for a quantum computer, one must specify how to decompose any valid quantum computation into a sequence of elementary one qubit and two qubit quantum gates that can be realized in physical hardware that is feasible to fabricate. The set of these one and two qubit gates is arbitrary provided it is universal, i.e., capable of achieving any valid quantum computation from a quantum circuit comprising only gates from this set. The set of gates also needs to be a universal set, i.e., one which permits universal quantum computation. Fortunately, many sets of gates are universal, see A. Barenco et al, "Elementary Quantum Gates for Quantum Computation", *Physical Review A* 52:3457 (1995), and references therein, which is incorporated herein by reference.

A widely accepted method of operating quantum computers is the "standard paradigm" of universal quantum computation. According to the standard paradigm, all operations necessary for a quantum computer can be performed by single qubit and two qubit operations, because these two types of operations generate the full special unitary 2 group, denoted $SU(2^N)$, which spans the space necessary for quantum computation. Quantum computers that generate the full $SU(2^N)$ group space for N qubits are sometimes referred to as universal quantum computers. In particular, two single qubit gates that are based on two non-commuting Hermitian operators can generate all one qubit quantum gates, and a two qubit gate can entangle the states of a two qubit quantum system. One qubit quantum gates alone, however, are only sufficient to generate the SU(2) group, which only spans the space necessary for quantum computation with a single qubit.

The two principal single qubit operations are tunneling and biasing. Typical designs, for example, that of U.S. application Ser. No. 09/839,637 require single qubit biasing. The operation of the superconducting elements and the basic devices has also been described, for example, by A. Blais and A. M. Zagoskin in "Operation of universal gates in a solid-state quantum computer based on clean Josephson junctions between d-wave superconductors," *Physical Review A*, Vol. 61, 042308 (2000), available as ArXiv.org/abs/quant-ph/9905043. This work described a system with single qubit bias, through circuits and other methods. However, designs with single qubit bias add considerable complication and expense to the fabrication of a quantum register. Another relevant design has been described by D. A. Lidar and L.-A. Wu in "Reducing Constraints on Quantum Computer Design by Encoded Selective Recoupling," *Physical Review Letters*, Vol. 88, 017905 (2002), on the web as ArXiv.org/abs/quant-ph/0109021 (2001). The described encoding schemes, however, were not applicable directly to superconducting qubits.

In general, single qubit biasing often requires external circuitry or even off-substrate systems that are difficult to design and fabricate. In addition, the physical interactions driving the single qubit operations are much slower than those used in two qubit operations. Promising solutions can be developed by replacing one-qubit operations by two-qubit operations. Such designs eliminate the slow and hard-to-fabricate external circuitry, leading to a more simplified implementation as well as to increases in the speed of operations, and other benefits.

To achieve these goals, physical qubits are replaced by logical qubits that are formed from two or more physical qubits; this is called encoding. Second, the single qubit operations are performed through the cooperation of the two or more physical qubits that make up the logical qubit. Some early proposals of such encoding schemes have been put forward, for example, by D. Bacon, J. Kempe, D. P. DiVincenzo, D. A. Lidar, and K. B. Whaley in "Encoded universality in physical implementations of a quantum computer," *Proceedings of the 1st International Conference on Experimental Implementations of Quantum Computation* (ed. R. G. Clark), pp. 257-264, (Rinton, N.J., 2001), available at ArXiv.org/abs/quant-ph/0102140, incorporated herein by reference in its entirety. Bacon et al. describe a logical qubit encoded via a grouping of physical qubits via Heisenberg interactions in a microscopic quantum computer.

Recently, the concept of recoupling of encoded states was proposed by D. A. Lidar and L.-A. Wu, "Reducing Constraints on Quantum Computer Design by Encoded Selective Recoupling", *Phys. Rev. Lett.*, 88:017905 (2002), available as ArXiv.org/abs/quant-ph/0109021 (2001), incorporated herein by reference in its entirety. However, the systems described differ in essential ways from the designs of superconducting quantum computers. Recoupling with pulses has been used in NMR based quantum information processing.

To date, no proposal has been put forward for a superconducting quantum computer that does not require individual qubit biasing. Nor is there a proposal for a superconducting quantum computer with encoded qubits. Finally, no proposals exist for operating such superconducting quantum computers efficiently.

Therefore, there is a need for superconducting quantum computers that replace single qubit operations, such as biasing, by encoded two qubit operations, while retaining the universality of the quantum computer. Fast and efficient methods of operating such quantum computers are also needed.

SUMMARY OF THE INVENTION

The present invention involves a method of quantum computing and an apparatus for providing a method of quantum computing. Specifically, the present invention provides a quantum computing structure, comprising one or more logical qubits, wherein each of the logical qubits is encoded into a plurality of superconducting qubits; and each of the logical qubits comprises at least one operating qubit and at least one ancilla qubit.

The present invention further provides a method of quantum computing, comprising: providing a plurality of logical qubits, encoded into a plurality of superconducting qubits wherein the logical qubits comprise operating qubits and ancilla qubits; and performing encoded quantum computing operations with the logical qubits.

The present invention additionally provides a method of error correction for a quantum computing structure comprising: presenting a plurality of logical qubits, each of which comprises an operating physical qubit and an ancilla physical qubit, wherein: the logical states of the plurality of logical qubits are formed from a tensor product of the states of the operating and ancilla qubits; and wherein the states of the ancilla physical qubits are suppressed; and applying strong pulses to the grouping of logical qubits.

BRIEF DESCRIPTION OF THE DRAWINGS

FIGS. 2A-F illustrate the basic building blocks and the overall scheme of an encoded register, a triangular lattice of superconducting phase qubit and logical qubit encoding.

FIGS. 3A, 3B illustrate the steps of encoded operations on a triangular embodiment.

FIGS. 7A-F illustrates examples of logical qubit encoding and register operation for codes of higher rate.

FIGS. 8A-D illustrates examples of logical qubit encoding for qubits known in the art.

DETAILED DESCRIPTION

Glossary

Figure 1:
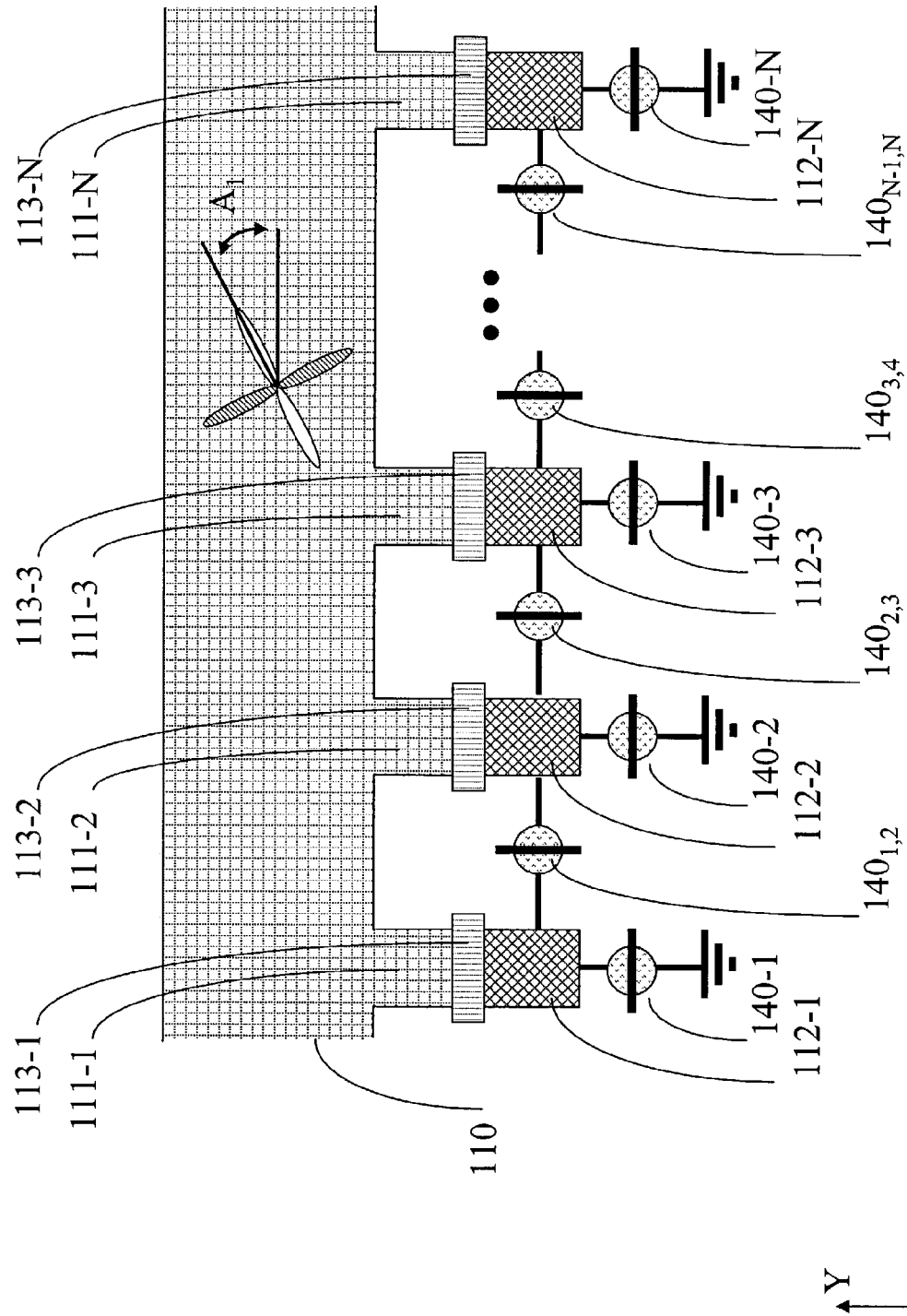
FIG. 1 illustrates a register of superconducting phase qubits from the prior art.

The following terms are used throughout the application in the context of quantum computing, and quantum computers.

Superconductor, or superconducting material: A material whose electrical resistance disappears completely under certain conditions. Most superconducting materials only superconduct over narrow ranges of temperature, current, pressure, and magnetic field. Theoretically, a loop of superconducting material is able to support a flowing electric current for an infinite length of time. Although the earliest discovered superconductors were metals such as lead, mercury, tin, and aluminum, non-metals such as organic materials and ceramics have more recently been shown to be superconducting.

Supercurrent: A current that flows in a superconductor. It may travel without an applied potential difference.

Cooper pair: The basic unit of supercurrent in a superconductor is a pair of electrons that is coupled by weak interactions to lattice vibrations. The Cooper pair is central to BCS theory. Cooper pairs comprise long-range coupling of electrons, often across many unit cells, and superconductivity arises from the collective motion of many Cooper pairs. Electrons that form a Cooper pair are in a state that has a zero net momentum and zero net spin. The relative orbital angular momentum of the Cooper pair can have a value of zero (referred to as an "s-wave"), one (referred to as a "p-wave"), two (referred to as a "d-wave"), and so forth.

Unconventional superconductor: A superconducting material with either an anisotropic order parameter or one that violates time reversal symmetry. Examples include all non s-wave superconducting material, e.g., d-wave and p-wave materials such as $Bi_2Sr_2Ca_{n-1}Cu_nO_{2n+4}$, $YBa_2Cu_3O_{7-x}$, $Tl_2Ba_2CuO_{6+x}$, and $HgBa_2CuO_4$. $Sr_2RuO_4$ and the heavy fermion material $CeIrIn_5$ are also examples of unconventional superconductors. It has been found that most high temperature superconductors known at this time are unconventional.

Order parameter: This term is associated generally with phase transitions, wherein some property can be characterized as being zero on one side of the phase transition and non-zero on the other side. In the case of a superconductor, the transition between the non-superconducting state and the superconducting state can be considered to be a phase transition. According to Ginzburg Landau theory, an early theory of superconductivity, the number density of superconducting charges is expressed as the amplitude of a quantity, $\Psi$, that resembles a wavefunction. For an s-wave material, the order parameter is given by the product of the superconducting energy, $\Delta$, and the phase of $\Psi$. The order parameter thus vanishes above the critical temperature.

Josephson junction: A Josephson junction comprises a pair of superconducting materials separated by a weak link, such that a non voltage current, i.e., supercurrent, flows across the link. A weak link is thought of as a region where the number of superconducting carriers, i.e., Cooper pairs is diminished. The weak link may be formed by a number of different means, including, principally: a thin layer of insulating material, across which charge carriers tunnel, giving rise to a "tunnel junction"; a normal non-superconducting, metal that is traversed by Cooper pairs; a grain boundary junction; a physical constriction formed by a point contact or an aperture; and a trench etched in, for example, a thin film of superconducting material. In general, then, a Josephson junction can be modeled as an interruption in the translational symmetry of a bulk of superconducting material. Typically, the interruption is on the order of the coherence length of the superconducting material. The Josephson junction has become a term of art applied to all structures which exhibit the Josephson effect.

Josephson energy. The amount of supercurrent through a Josephson junction is given by $I_S$. The maximum supercurrent, without introducing a voltage current, is $I_C$. The equation $I_S=I_C \sin(\phi-\phi_o)$, wherein $\phi_o$ is a ground state zero current phase difference, is the first Josephson relation and illustrates that the amount of supercurrent across the junction is controlled by a phase difference. The supercurrent through a Josephson junction also has a free energy associated with it, called the Josephson energy, $E_J$, given by $E_J=\hbar I_C/2e$. The Josephson energy determines the strength of the Josephson junction.

π-phase shift: A shift of π radians in the phase of the wavefunction of the supercurrent from one side of a Josephson junction to the other.

π-junction. When a Josephson junction has a ground state zero current phase difference of about π then it is called a π-junction.

Mesoscopic: a class of solid systems of intermediate size, i.e., macroscopic but small enough (e.g., in the sub-micron range, $\leq$about 1 μm in each direction) to support discrete quantum states, and small enough that quantum interference is very important, since at low enough temperatures (e.g., <about 1 K) the phase coherence length of quasiparticles ("electrons") exceeds the size of the system. See, A. Zagoskin, *Quantum Theory of Many Body Systems*, Springer, (1998), at page 19, (citing Y. Imry, "Physics of Mesoscopic Systems", in *Directions in Condensed Matter Physics: Memorial Volume in Honor of Shang-Keng Ma*, G. Grinstein, G. Mazenko, eds., World Scientific, (1986)). For example, U.S. Pat. No. 6,459,097 describes a mesoscopic island as having dimensions about 0.2 μm in width by about 0.5 μm in length.

Parity key: In general, devices that pass supercurrent and normal current, or a mixture depending on the gate input, e.g., voltage in the case of a SET, or flux in the case of a SQUID, are parity keys. See Y. Makhlin, G. Schön, and A. Shnirman, "Quantum-State Engineering with Josephson-Junction Devices", *Reviews of Modern Physics*, 73, 357, (2001), at page 371. Examples of a parity key include an SET and a flux modulated SQUID. When a single-electron transistor (SET) operates as a parity key, it is preferably tuned so that it only passes Cooper pairs, and only at certain gate voltages. (See P. Joyez, et al, "Observation of Parity-Induced Suppression of Josephson Tunneling in the Superconducting Single Electron Transistor", *Physical Review Letters*, 72:2458-2461, (1994)).

Fault-tolerant quantum computing: A means of running a quantum computer for an arbitrarily long time. Errors are identified and corrected. Embodiments of Fault-tolerant quantum computing include the disclosure by Steane. See A. Steane, "Multiple Particle Interference and Quantum Error Correction" Los Alamos National Laboratory preprint quant-ph/9601029 (1996).

Scalable quantum computing: A quantum computer should be scalable i.e., extra qubits can be added without consuming excessive resources or destroying function. NMR qubits are not scalable because an always on coupling leads to a decline in signal strength for each qubit added. It is held that 30 qubits is the limit for NMR.

Qubit: A qubit (or, more precisely, the embodiment of a qubit) is a quantum system traditionally with two levels. Examples include the two spin states of a spin ½ particle, the ground and excited states of an atom, or the vertical and horizontal polarization of a single photon. It is a well defined physical entity that is quantum mechanical in nature and is the elementary unit of a quantum computer. See M. A. Nielsen and I. L. Chuang, *Quantum Computation and Quantum Information*, Cambridge Univ. Pr. (2000).

Phase qubit: A superconducting qubit that has phase as a good quantum number. Phase and charge are conjugate variables, like position and momentum, i.e., $[N,\phi]$=ih. In a a phase qubit, the phase is the variable that has greater certainty associated with its measurement, and is observed either directly or indirectly. The Josephson energy should preferably exceed the Coulomb energy, $E_C$, but the Coulomb energy is the source of kinetic energy for the system. Therefore, $E_C$ is preferably non negligible i.e., $E_C \approx (0.10) E_J$.

Charge qubit: A superconducting qubit that has charge as a good quantum number. In a charge qubit, the charge is the variable that has greater certainty associated with its measurement, and is observed either directly or indirectly.

Theoretical Background

A quantum computing system is represented, mathematically, by a Hamiltonian. The Hamiltonian comprises a number of terms which themselves contain one or more operators. A computing system, in general, comprises a number of gates that perform various logical operations. The terms in a Hamiltonian for a quantum system correspond to gates in a quantum circuit, i.e., an array of states that evolve over time and which are coupled by unitary gates and are manipulated by other operations such as a measurement operation. The gates in a quantum circuit are unitary. A unitary gate can be generated from logic operations in a universal set. A unitary gate can also be represented by one or more exponentiated operations in a Hamiltonian.

A quantum computing system comprises operations that, together, generate the full special unitary 2 group, $SU(2^N)$. A group G, such as the $SU(2^N)$ group, is a finite or infinite set of elements, and a binary operation. The operation with respect to which a group is defined is often called the "group operation," and a set is said to be a group "under" this operation. The, elements A, B, C, ..., with binary operation between A and B denoted AB form a group when they have the following properties:

(i) closure: if A and B are two elements in G, then the product AB is also in G;

(ii) associativity: under the group operation, multiplication is associative: i.e., for all A, B, C∈G, (AB)C=A(BC);

(iii) identity: there is an identity element I (also represented as 1, E, or e) such that IA=AI=A for every element A∈G; and (iv) inverse: there must be an inverse or reciprocal of each element, i.e., the set must contain an element $B=A^{-1}$ such that $AA^{-1}=A^{-1}A=I$ for each element, A, of G.

The $SU(2^N)$ group satisfies these conditions. The $SU(2^N)$ group is a subset of unitary 2. Unitary 2 is a group where the objects are 2 by 2 matrices that are unitary, i.e., $UU^\dagger=1$, and the operation is matrix multiplication. $SU(2^N)$ has the general group element:

$$U = \begin{pmatrix} a & b \\ -b^* & a^* \end{pmatrix}$$

with $a^*a+b^*b=1$ and where a and b are complex. For more information on special unitary groups, see Arfken, *Mathematical Methods for Physicists*, Third Edition, Academic Press, Inc., San Francisco, (1985).

In order to build a quantum computer, it is necessary to be able to construct gates from single qubits, and pairs of qubits. With such gates it is possible to represent the operations that generate the $SU(2^N)$ group. There are many sets of unitary gates that enable quantum computation.

A common example of a two qubit gate is the "controlled NOT" (CNOT) gate. The CNOT gate has two input qubits, known as the control qubit and the target qubit, respectively. The action of the CNOT gate can be described as follows. If the control qubit is set to 0, then the target qubit is left alone. If the control qubit is set to 1, then the target qubit is flipped. However, any classical (e.g., AND) or quantum (e.g., CPHASE, or "controlled phase", as discussed hereinbelow) two qubit logic gate can be used.

Alternatively, one can use a discrete set of single qubit operations together with an entangling gate, to approximate, to arbitrary accuracy, any quantum gate. An example of a such a discrete set of logic gates is, HADAMARD, PHASE (or S), π/8 (or T), and an entangling gate such as CNOT. See Nielsen and Chuang, 2000, Quantum Computation and Information Processing, Cambridge University Press, which is hereby incorporated by reference in its entirety. The HADAMARD gate is often referred to as a "Fourier transform on one bit."

An aspect of the invention is to provide scalable superconducting quantum computers where the logical qubits are encoded into more than one physical qubits. Realizations of such physical qubits will be detailed hereinbelow. In some designs, a logical qubit includes two physical qubits, called an operating qubit and an ancilla qubit. One role of the ancilla qubits is to provide a bias for the operating qubits. This design replaces single qubit biasing with a two qubit operation, thus removing the need for external biasing circuitry. In general, a qubit composed of superconducting material is referred to as a superconducting qubit.

The Principle of Operations with Ancilla Qubits

Various aspects of quantum computation will be illustrated in embodiments of the invention, where the physical qubits have two quantum states. The two quantum states are often labeled |0> and |1>. The similarities between these quantum states and the 0 and 1 states of a binary computer make these quantum states promising candidates for purposes of computation. However, there are important differences as well. A qubit is capable of evolving from one state to another state in a quantum mechanical manner. For example, a qubit can be in a superposition of both states. Simply put, this means that the qubit is effectively in both quantum states at once.

Quantum operations on the two quantum states will be described in terms of the well-known Pauli operators $\sigma^X$, $\sigma^Y$, and $\sigma^Z$. For a two quantum state system the Pauli operators can be represented as shown in Equations (1-3):

$$\sigma^x = \begin{pmatrix} 0 & 1 \\ 1 & 0 \end{pmatrix} \quad (1)$$

$$\sigma^y = \begin{pmatrix} 0 & -i \\ i & 0 \end{pmatrix} \quad (2)$$

$$\sigma^z = \begin{pmatrix} 1 & 0 \\ 0 & -1 \end{pmatrix} \quad (3)$$

The dynamics, as given by, for example, the evolution over time, of a quantum system are determined by its Hamiltonian, H. The Hamiltonian for a quantum computer can include terms based on operators representing one and two qubits. Single-qubit operations include $\sigma^X$, which represents transitions from one quantum state to the other, for example, by tunneling. The $\sigma^X$ operation functions as a bit-flip operation. Another single qubit operator, $\sigma^Z$, represents the bias of the qubit, due to the difference between the energies of the two quantum states for superconducting qubits. Such a bias can be achieved in many different ways, including application of an external magnetic field. The $\sigma^Z$ operation functions as a phase-flip operation.

If the system of quantum states, i.e., the basis of the qubit is chosen differently, then the Pauli operators are represented by another set of matrices. Various choices of the quantum states are discussed in the above referenced review of Y. Makhlin, G. Schön, and A. Shnirman, "Quantum-State Engineering with Josephson-Junction Devices", *Reviews of Modern Physics*, Vol. 73, pp. 357-400 (April 2001), incorporated herein by reference in its entirety. These choices include representing the quantum states of the qubit according to the charge or the phase of the qubit.

In most designs, qubits are coupled together, often pairwise. The function of such pairwise couplings includes facilitating the entanglement of the quantum states of the coupled qubits. Systems can be designed with many different couplings. As an example, qubits can be coupled by Josephson coupling, a mechanism that is practically applicable to superconducting qubits. A Josephson coupling is a Hamiltonian term proportional to the cosine of a phase difference. In the two state approximation, this is an Ising like interaction, although Ising interactions encompass a larger class of interactions. Therefore, for the purposes of quantum computing in superconducting registers, a Josephson coupling is a term in ZZ. Such a coupling is represented in the Hamiltonian by a two qubit term containing $\sigma_i^z \sigma_j^z$, where the "⊗" denotes the so-called tensor product. This two qubit term acts on the direct product of the two states of the i-th and j-th qubit, having 2*2=4 components and is thus represented by a 4-vector. In the present basis, the tensor product reads as:

$$\sigma^z \otimes \sigma^z = \begin{pmatrix} 1 & 0 & 0 & 0 \\ 0 & -1 & 0 & 0 \\ 0 & 0 & -1 & 0 \\ 0 & 0 & 0 & 1 \end{pmatrix} \quad (4)$$

However the invention works for other couplings besides ZZ, the invention will work for YY couplings as in the case of inductively coupled charge superconducting qubits, and for other couplings.

A generic form of the Hamiltonian, $H_S$, of a system of qubits that involves a Josephson coupling is expressed as: $H_S=H_X+H_Y+H_Z+H_{ZZ}+E$, where $H_X$ represents the tunneling term $\sigma^X$, $H_Y$ represents the term proportional to $\sigma^Y$, $H_Z$ represents the bias term $\sigma^Z$, and $H_{ZZ}$ comprises the coupling term $\sigma_i^z\sigma_j^z$. The last term E is an error term, arising from the coupling of a qubit to its environment.

An example of the coupling term, $H_{ZZ}$, is a Josephson coupling term, which is given by: $J_{ij}\sigma_i^z\sigma_j^z$. The coefficient $J_{ij}$ is the magnitude of the coupling and in most cases is positive. A negative coefficient can be achieved by placing in line between the i and j qubit, a so called π-junction, as described by Y. Makhlin, G. Schön, and A. Shnirman in "Quantum-State Engineering with Josephson-Junction Devices," *Reviews of Modern Physics*, Vol. 73, pp. 3577-400 (2001), previously incorporated by reference. Various further realizations of Josephson couplings between qubits have been described in U.S. Pat. No. 6,459,097 B1 entitled "Qubit using a Josephson Junction between s-Wave and d-Wave Superconductors," to Zagoskin, and by A. Blais and A. M. Zagoskin in "Operation of universal gates in a solid-state quantum computer based on clean Josephson junctions between d-wave superconductors," *Physical Review A*, Vol. 61, 042308 (2000), available as ArXiv.org/abs/quant-ph/9905043.

The system Hamiltonian Hs need not contain so many terms. The $\sigma^Y$ term is not a primitive operation implemented in a typical quantum register so it can normally be removed from the system Hamiltonian. The "standard paradigm" of universal quantum computation requires only the tunneling, biasing and entangling terms. Therefore, an ideal example of a quantum register has a system Hamiltonian $H_S=H_X+H_Z+H_{ZZ}$ which is sufficient for permitting quantum computation to be carried out.

The terms in the Hamiltonian interfere with each other's effect. Typically, the tunneling term $H_X$ between the two quantum states is effective when the energy levels of the two quantum states are very nearly equal to one another, a situation called resonance. When the two energy levels are not equal, the tunneling term's contribution to the dynamics of the system is exponentially suppressed. Energy levels that are in resonance can be shifted to different values, for example, by either the bias term $H_Z$, or by the Josephson term $H_{ZZ}$. As a result, when the bias term $H_Z$ or the Josephson coupling $H_{ZZ}$ is turned on for a particular qubit, the contributions of the tunneling term to the dynamics of the qubit are exponentially suppressed. Therefore, the Hamiltonian can be approximated as at any given time having either the tunneling, or the bias/Josephson terms effective.

A Quantum Register

FIG. 1 illustrates an example of a quantum register 100. A quantum register, as is commonly understood in the field, means an array of qubits. In contrast to conventional binary registers, quantum registers store quantum information and allow that quantum information to evolve through quantum interactions, including quantum tunneling, bias or phase flip interactions, and controlled entanglements of quantum states. These interactions do not have analogs in conventional binary circuitry.

In FIG. 1, N denotes the total number of qubits in the quantum register 100 and the index 1 denotes a specific element. Typically, herein, logical qubits are numbered from 1 to N. Quantum register 100 includes a bank of unconventional superconducting material 110, a set of optional fingers 111-1 through 111-N, a set of mesoscopic islands 112-1 through 112-N, and a set of Josephson junctions 113-1 through 113-N that connect the fingers 111 to the islands 112. In such a register, a particular qubit is comprised of a specific finger 111-i, connected to mesoscopic island 112-i through Josephson junction 113-i.

The qubits of the register in FIG. 1 are superconducting phase qubits and such a superconducting register was disclosed in U.S. Pat. No. 6,459,097 B1 entitled "Qubit using a Josephson Junction between s-Wave and d-Wave Superconductors," to Zagoskin, incorporated herein by reference. Further examples of phase qubits were described by J. E. Mooij, T. P. Orlando, L. Levitov, L. Tian, C. H. van der Wal, and S. Lloyd in "Josephson persistent-current qubit," *Science*, Vol. 285, 1036 (1999), and by T. P. Orlando, J. E. Mooij, L. Tian, C. H. van der Wal, L. S. Levitov, S. Lloyd, and J. J. Mazo in "Superconducting persistent current qubit," *Physical Review* B, Vol. 60, 15398 (1999). Superconducting phase qubits are superconducting qubits that have definite values of phase as good quantum numbers. Phase and charge are conjugate variables in superconducting materials. The definite values of phase are basis states (and bit states) of a phase qubit. In a charge qubit the bit is the definite values of charge that are the basis states (and bit states) of the qubit. It is to be understood that any type of superconducting phase qubit can be used with the present invention. Additionally, it would also be understood by one of ordinary skill in the art that a register of charge qubits could be used to practice the current invention.

Other quantum register designs were described by M. H. S. Amin, A. N. Omelyanchouk, A. Maassen van den Brink, A. Blais, G. Rose, and T. L. Duty in U.S. application Ser. No. 09/839,637, entitled "Quantum Bit with a Multi-Terminal Junction and Loop with a Phase Shift," and by A. Ya. Tzalenchuk, Z. G. Ivanov, and J. P. Hilton in U.S. application Ser. No. 10/025,848 entitled "Finger Squid Qubit Device,", all of which are incorporated herein by reference in their entirety.

The bank 110 can be formed from unconventional superconducting material. Such a material must have a non-zero angular momentum in the pairing symmetry of its order parameter. For example, this property occurs in high-Tc cuprates such as $YBa_2Cu_3O_{7-x}$, a material with so called d-wave symmetry, where x takes on values between 0.0 and about 0.6, or in $Bi_2Sr_2Ca_{n-1}Cu_nO_{2n+4}$, $Tl_2Ba_2CuO_{6+x}$, or $HgBa_2CuO_4$. An example of a low temperature superconductor with non-zero angular momentum is $Sr_2RuO_4$, which has p-wave superconducting pairing symmetry of its order parameters.

The Josephson junctions 113 can be grain boundary Josephson junctions, wherein the crystal lattice orientation of the superconducting material on one side of the grain boundary varies from the crystal lattice orientation of the superconducting material on the other side of the grain boundary. FIG. 1 illustrates an example with a d-wave material. Note one of the positive lobes of order parameter is depicted as being at an angle $A_1$ with respect to the principal direction of the plane of the Josephson junction 113.

The phase difference of these islands across the Josephson junctions 113 is a good quantum number suitable for forming the bit states of the quantum computer. Physically the phase difference also corresponds to the direction of circulating supercurrent at 113 and to the direction of the associated magnetic flux.

Also depicted are switches 140 between individual mesoscopic islands 112. These allow for controllable coherent connections to be established between the qubits. In some quantum registers, switches 140 can be superconducting single electron transistors (SSET), parity keys, or Single Cooper Pair transistors (SCPT). Herein, the term single Cooper pair transistor will encompass parity keys, SCPT's, and SSET's. The use of SSETs, sometimes called parity keys, have also been described in U.S. Pat. No. 6,459,097 B1 to Zagoskin.

A Method of Initializing Designs with Ancilla Qubits

In accordance with an embodiment of the present invention a mechanism for initializing a quantum register is introduced. An aspect of the present invention retains all requirements associated with the standard paradigm of quantum computing see D. P. DiVincenzo, *Fortschritte der Physik*, Vol. 48, p. 771 (2000), available as AriXiv.org/abs/quant-ph/00020777 (2000), each of which is incorporated herein by reference in its entirety. One of the requirements includes the ability to prepare the quantum computer in a generic initial fiducial state. In accordance with the standard paradigm, in this fiducial state all qubits are in the |0> state. However, the physical qubits have their own dynamics, and can evolve into a |0> or a |1> state, or typically, into a superposition of these two states.

In a quantum computer which contains a measurement system, i.e., a means for measuring the state of a qubit, initialization can be implemented through measuring the quantum states of the qubits with this measurement system. This method is different from using single qubit operations based on the $\sigma^z$ terms. According to the well-established interpretation of quantum mechanics, performing a measurement on a quantum system projects the system into one of its quantum states. Hence, measuring the $i^{th}$ physical qubit projects this qubit either into the $|0_i>$ or $|1_i>$ quantum state. Therefore, if the $i^{th}$ physical qubit needs to be initialized into a particular state, $|0_i>$ or $|1_i>$, the $i^{th}$ physical qubit is measured repeatedly until the desired initial quantum state $|0_i>$ or $|1_i>$ is observed. In particular, ancilla qubits are initialized into the $|1_i>$ state. Since tunneling can change the quantum state of a qubit even after such measurements, one embodiment of the method is to measure the state of operating qubits, which need to be initialized into a |0> or a |1> state simultaneously with ancilla qubits, which need to be in the |1> state, until the desired initial quantum states are observed in both qubits. In an alternative embodiment, the register can be field cooled to initialize all physical qubits.

An example of a measurement system in a quantum computer is described in U.S. Pat. No. 6,459,097 B1 to Zagoskin, entitled "Quantum Processing System for a Superconducting Phase Qubit," herein incorporated by reference in its entirety.

Designs with Ancilla Qubits

The single qubit biasing of designs found in the prior art are achieved through secondary circuitry that is not pictured in FIG. 1. An example of such biasing is the application of a local magnetic field on each qubit, as described in U.S. Pat.

No. 6,459,097 B1 entitled "Qubit using a Josephson Junction between s-Wave and d-Wave Superconductors," to Zagoskin, and by A. Blais and A. M. Zagoskin in "Operation of universal gates in a solid-state quantum computer based on clean Josephson junctions between d-wave superconductors," *Physical Review A*, Vol. 61, 042308 (2000), on the web as ArXiv.org/abs/quant-ph/9905043 (1999), both of which are incorporated herein by reference in their entirety.

As discussed hereinabove, encoding a logical qubit into two physical qubits by replacing the single qubit bias with a two qubit term makes the fabrication of a quantum register easier and its operation faster. A generic and several specific designs of quantum registers without single qubit biasing are described hereinbelow. The corresponding Hamiltonian for these designs takes the generic form: $H_S = H_X + H_{ZZ} + E$.

Regarding a generic design with ancilla qubits, FIG. 2A illustrates two coupled physical qubits. Qubit 1 is an operating qubit, qubit 2 is an ancilla qubit, and they are coupled by a switchable coupling 3. An example of a switchable coupling 3 is a parity key whose gate voltage can be modulated. This realizes a controlled phase coupling.

Operating qubit 1 and ancilla qubit 2 each have two quantum states. Designs with more quantum states can also be constructed. Physical qubits 1 and 2, and switchable coupling 3 operate together to appear as a single qubit with a bias for the other circuit elements. This apparent qubit is often referred to as a logical qubit 4.

A function of ancilla qubit 2 is to provide a bias for operating qubit 1. One way to achieve this biasing is to completely suppress the dynamics of ancilla qubit 2, in effect "freezing" it into one of its quantum states. It takes an effort to completely freeze the dynamics of most quantum mechanical systems. However, an advantage of the designs of the present invention is that they do not require subsequent corrective actions during their operations. Through switchable coupling 3 the frozen state of ancilla qubit 2 provides a bias for the operating qubit 1 much like an external single qubit bias circuitry would.

As would be understood by one of ordinary skill in the art, there are a number of ways of suppressing the dynamics of ancilla qubit 2. In general, such ways include altering the properties of the Josephson junction, such as increasing its capacitance, or increasing its width.

In an alternative embodiment, the dynamics of ancilla qubit 2 are only partially suppressed. In such designs, the ancilla qubit is refocused into a selected quantum state by the time a bias has to be provided for the operating qubit. It is easier to suppress the dynamics of a qubit partially than completely, but these designs have to perform the additional step of refocusing the ancilla qubit.

In still other embodiments, it is possible to avoid suppressing the dynamics of the ancilla qubit, and to refocus it when a bias has to be provided for the operating qubit. One advantage of such designs is simplicity because the dynamics of the ancilla qubit are not suppressed. However, in these designs a larger effort is spent on the refocusing of the ancilla qubit into a selected state.

The switchable coupling 3 between the two physical qubits makes the frozen state of the ancilla qubit 2 appear as a bias for the operating qubit 1. Switchable coupling 3 can controlled: e.g., it can be switched on and off to facilitate the refocusing of the ancilla qubit 2.

FIG. 2B illustrates a layout of a generic quantum register 170 that includes N logical qubits 4-1 through 4-(2N−1). Each logical qubit 4-i is constructed from an operating and an ancilla qubit. The quantum register 170 includes a set of operating qubits 1-1 through 1-(2N−1), and a set of ancilla qubits 2-1 through 2-(2N−1). In some designs the number of operating qubits and ancilla qubits can be different. In the embodiment of FIG. 2B, within a logical qubit 4-i the operating qubit 1-i is coupled to the ancilla qubit 2-i by a switchable coupling 3-i. The logical qubit 4-i is coupled through a logical coupling 5-i to the logical qubit 4-(i−1), and through logical coupling 5-(i+1) to logical qubit 4-(i+1), thereby forming a quantum register 170 with a chain like architecture. The logical-coupling 5-i is a switchable coupling like coupling 3-i. However, logical coupling 5-i can be of a different type, such as a different type of 2-qubit operation, than switchable coupling 3-i. Furthermore, a logical coupling such as 5-i can be a grouping of several couplings. As described hereinabove, the refocusing of an ancilla qubit 2-i can be achieved by switching on a switchable coupling 3-i and a logical-coupling 5-i at an appropriate time instant t and switching them off at a later time instance t' by some control mechanism.

Many variations of the generic design shown in FIG. 2B are possible. Some designs have additional neighbor couplings, some designs have couplings between far lying qubits. Some designs have a different layout wherein the qubits do not form a chain, but, for example, a loop. In some designs the relation between physical qubits and logical qubits is more complex. All of these alternative designs are understood to be within the scope of the invention, and several representative designs are described below.

Figure 2C:
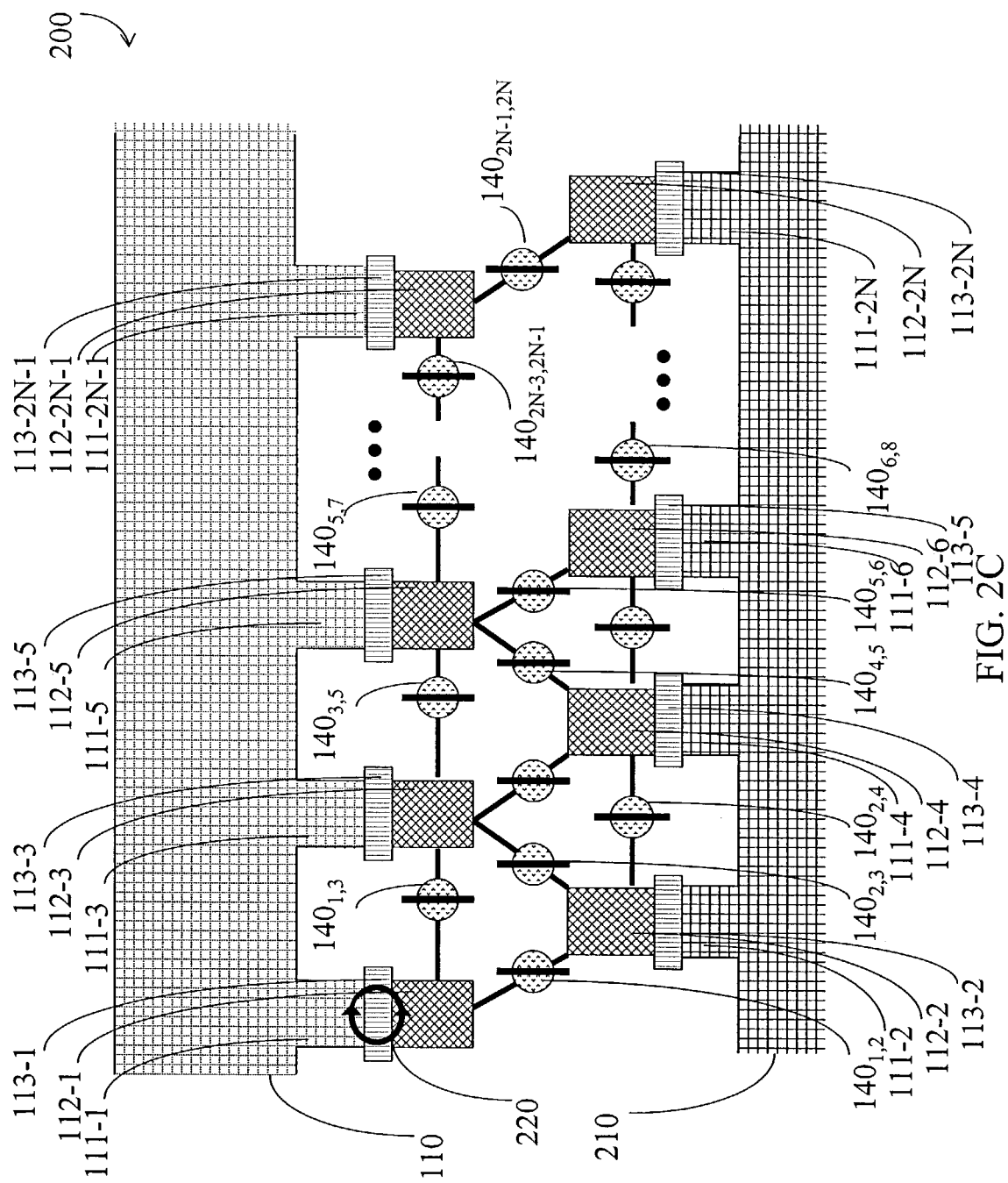

FIG. 2C illustrates a first embodiment of a design with ancilla qubits. A quantum register 200, according to an embodiment of the invention, wherein the logical qubits each include two physical qubits. The i-th logical qubit is comprised of the (2i−1)-th physical qubit which functions as an operating qubit, and the (2i)-th physical qubit which functions as an ancilla qubit. The quantum register 200 utilizes an operating superconducting bank 110 and an ancilla superconducting bank 210. The ancilla bank 210 is limited by the same design criteria as 110 but is disjoint and possibly made from different material. The banks 110 and 210 need not be parallel as depicted.

Superconducting banks 110 and 210 are formed from unconventional superconducting materials, which have order parameters with non-zero angular momentum. Examples of order parameters with non-zero angular momentum are those having p-wave or d-wave symmetries. Examples include high-Tc cuprates such as $YBa_2Cu_3O_{7-x}$, a family of materials with d-wave symmetry, where x takes on values between 0.0 and about 0.6. Other members of this family of materials include $Bi_2Sr_2Ca_{n-1}Cu_nO_{2n+4}$, $Tl_2Ba_2CuO_{6+x}$, and $HgBa_2CuO_4$. An example of a low temperature superconductor with non-zero angular momentum is $Sr_2RuO_4$, whose order parameter has a p-wave symmetry.

In the embodiment of FIG. 2C, the operating qubits 1-i are formed from one of the odd numbered operating fingers 111-1 through 111-(2N−1), odd numbered operating Josephson junctions 113-1 through 113-(2N−1), and odd numbered mesoscopic superconducting operating islands 112-1 through 112-(2N−1). In some designs the Josephson junctions 113-(2i+1) are formed directly on the operating superconducting bank 110, without operating fingers 111-(2i+1).

In an analogous manner, the ancilla qubits 2-i are formed from the even numbered ancilla fingers 111-2 through 111-2N, the even numbered ancilla Josephson junctions 113-2 through 113-2N, and the even numbered mesoscopic superconducting ancilla islands 112-2 through 112-2N. In some designs the Josephson junctions 113-(2i) are formed directly on the ancilla superconducting bank 210, without ancilla fingers 111-(2i).

The Josephson junctions 113 can be grain boundary Josephson junctions, wherein the crystal lattice orientation of the superconducting material on one side of the grain boundary, for example, of the ancilla fingers 111-(2i) or the operating fingers 111-(2i+1), differs from the crystal lattice orientation of the superconducting material on the other side of the grain boundary, for example, of the ancilla islands 112-(2i) or of the operating mesoscopic islands 112-(2i+1). In unconventional superconductors the orientation of the order parameter is typically determined by the crystal lattice orientation. FIG. 1 illustrates an example, where the ancilla superconducting bank 210 and its ancilla fingers 111-(2i) include a d-wave superconductor, and where the operating superconducting bank 110 and its operating fingers 111-(2i+1) include a d-wave superconductor.

The phase difference of the superconducting order parameters between a finger 111 and an island 112 is sometimes referred to as the phase difference across a Josephson junction 113. Physically the phase difference corresponds, for example, to the direction of circulation of a circulating supercurrent 220-(2i+1), centered at operating Josephson junction 113-(2i+1). Furthermore, a magnetic flux is associated with the circulating supercurrent 220-(2i+1), and the direction of circulation determines the direction of the flux. As described in U.S. Pat. No. 6,459,097 B1 entitled "Qubit using a Josephson Junction between s-Wave and d-Wave Superconductors," to Zagoskin, the phase differences across the Josephson junctions 113 are good quantum numbers for the quantum states of a qubit, |0> and |1>.

In the quantum register 200 of FIG. 2C, the mesoscopic islands 112 are arranged in a linked chain of triangles between the two banks 110 and 210. The logical qubits are encoded into physical qubit pairs by coupling the operating qubits and the ancilla qubits by switchable biasing phase-flip couplings 140-i,(i+1). In the present embodiment, the operating and ancilla qubits are coupled by coupling their corresponding mesoscopic islands 112-i and 112-(i+1), as indicated by the indices of the switchable phase-flip couplings 140-i,(i+1). When the switchable phase-flip couplings 140-i,(i+1) are switched on, the ancilla qubits are capable of providing a bias for the operating qubits.

Furthermore, there are switchable operating couplings 140-(2i−1),(2i+1) between the mesoscopic islands 112-(2i−1) and 112-(2i+1). These operating couplings are used, among other things, for performing quantum operations with two operating qubits. Also, there are switchable refocusing couplings 140-2i,(2i+2) between the mesoscopic islands 112-2i and 112-(2i+2). These couplings are used, among other things, for the refocusing of the ancilla qubits. As described hereinbelow, however, in some refocusing operations other switchable couplings are utilized as well. Quantum registers with a number of other layouts and topologies can also be designed.

In the embodiment of FIG. 2C, the switchable couplings 140 are preferably Josephson couplings described by an $H_{ZZ}$ term in a Hamiltonian, i. e., a term of the form $J_{ij}\sigma_i^z\sigma_j^z$. As discussed hereinabove, the $J_{ij}$ coefficient can be made negative by introducing a π-junction between the i and j qubit, i.e., in line with a switchable coupling 140-(i,j).

Figure 2E:
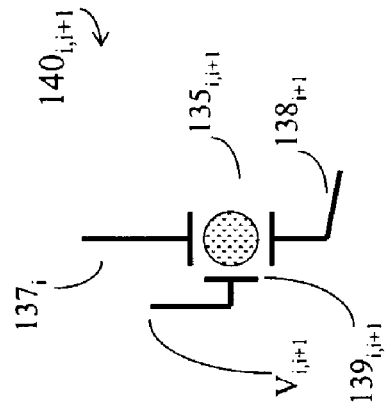
Figure 2F:
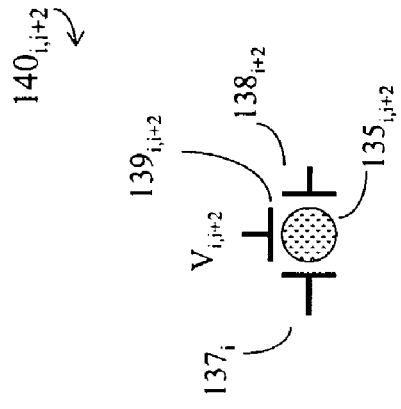
Figure 2D:
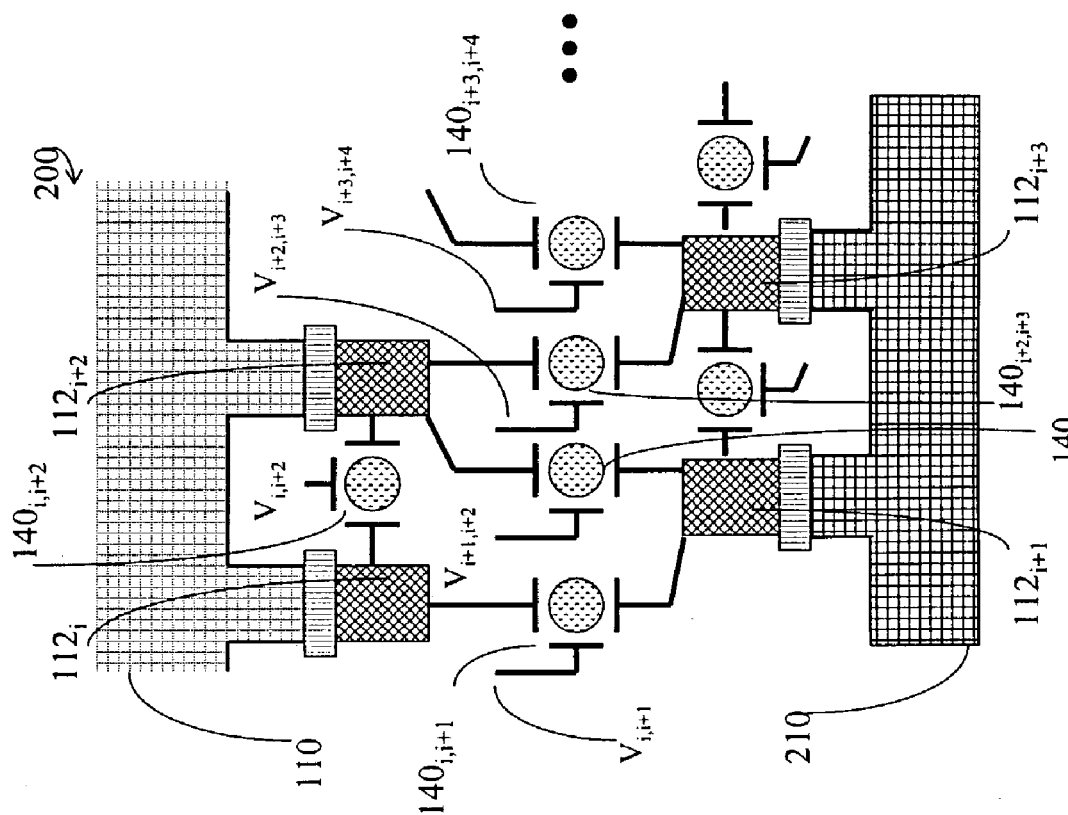

FIG. 2D further illustrates a portion of register 200 by showing embodiments of the switches 140. The switches 140 here include mesoscopic transistor islands 135-i, which are typically of mesoscopic size. One mechanism, applicable in some designs, to make the operating couplings, phase-flip couplings, and ancilla couplings switchable, is as follows.

Here items 140 are superconducting single Cooper-pair transistors (SSCTs). The use of SSCTs as switchable couplings has been detailed in U.S. Pat. No. 6,459,097 B1 entitled "Qubit using a Josephson Junction between s-Wave and d-Wave Superconductors," to Zagoskin. FIG. 2E further illustrates an embodiment of a switch 140.

FIG. 2E further illustrates an embodiment of a switch 140. The switch 140-(i,i+1) is a SSCT that is placed between an operating and an ancilla qubit, coupling islands 112-i and 112-(i+1). The SSCT is comprised of a mesoscopic transistor island 135-(i,i+1), which is typically of mesoscopic size. The transistor island 135-(i,i+1), is called mesoscopic, if its size is comparable to, or less than, the inelastic scattering length of electrons of the transistor island. The transistor island is coupled to the rest of the circuitry with capacitive couplings. The transistor island is coupled to the mesoscopic island 112-i with operating capacitive couplings 137-i, acting as a source. The transistor island is coupled to the mesoscopic island 112-i with ancilla capacitive couplings 138-(i+1), acting as a drain. In other embodiments of the present invention, the labeling of the source and drain can be reversed. The third capacitive coupling is the gate electrodes 139-(i,i+1). The magnitude of the coupling between the mesoscopic island 112-i and 112-(i+1), and thus between the corresponding qubits, can be tuned continuously by tuning the gate voltage $V_{i,i+1}$ applied to the transistor islands 135-(i,i+1) via the gate electrodes 139-(i,i+1). A large enough change in $V_{i,i+1}$ is capable of switching the coupling between the mesoscopic islands 112-i and 112-(i+1) through the transistor island, from insulating to conducting.

FIG. 2F illustrates an additional embodiment of a switch 140. The switch 140-(i,i+2) is a SSCT that is placed between adjacent mesoscopic islands 112-i and 112-(i+2). There is an equivalent coupling between mesoscopic islands 112-(i+1) and 112-(i+3). The SSCT couples a first operating and a second operating qubit (or a first ancilla and a second ancilla qubit). The transistor island of the SCPT is coupled to the rest of the circuitry with capacitive couplings. The transistor island is coupled to the mesoscopic islands 112-i with an operating capacitive coupling 137-i, a source. The transistor island is coupled to the mesoscopic island 112-(i+2) with ancilla capacitive coupling 138-i, acting as drains. The third capacitive couplings are gate electrodes 139-(i,i+2). The magnitude of the coupling between the mesoscopic island 112-i and 112-(i+2), and thus between the corresponding qubits, can be tuned continuously by tuning the gate voltage $V_{i,i+2}$ applied to the transistor islands 135-(i,i+2) via the gate electrodes 139-(i,i+2). The tuning of the voltage switches the operating coupling. There is an equivalent setup for ancilla coupling between two adjacent ancilla qubits.

Operation of Ancilla Qubits

FIGS. 3A,B illustrate the operation of the quantum register 200, showing the qubits at a higher level of abstraction. Although the illustration refers to the type of quantum register depicted in FIGS. 2A-2D, the method of operation can be achieved with other embodiments as well.

Referring again to the embodiment of FIG. 2B, the i-th logical qubit includes the operating qubit (2i−1) and the ancilla qubit 2i. In the more specific embodiment of FIG. 2C the operating qubit 1-i includes operating fingers 111-(2i−1), operating mesoscopic islands 112-(2i−1), and operating Josephson junctions 113-(2i−1). Furthermore, the ancilla qubit 2-i includes ancilla fingers 111-2i, ancilla mesoscopic islands 112-2i, and ancilla Josephson junctions 113-2i. The quantum states of ancilla qubit 2-i bias the operating qubit 1-i through switchable coupling 3-i, whose function in FIG. 2C is played by switchable coupling 140-(2i−1),2i. The ancilla qubit can be frozen into a selected quantum state, or its state can be refocused into a selected quantum state at suitable time instances. In both cases, the ancilla qubit will appear for the operating qubit as being in a selected quantum state, say the |1> state. Therefore, the following simplified notation will be used herein for the quantum states of the two physical qubits, making up the logical qubit, denoted as a subscript-L:

$$|0_i\rangle_L = |0_{2i-1}\rangle|1_{2i}\rangle \equiv |0_{2i-1}1_{2i}\rangle \quad (5)$$

$$|1_i\rangle_L = |1_{2i-1}\rangle|1_{2i}\rangle \equiv |1_{2i-1}1_{2i}\rangle \quad (6)$$

Equations (5) and (6) define a "code space" which, in general, is particular to a given quantum computing system. For an encoding system to be universal, the ancilla qubit must always be in the |1> state. If it is not, the encoding fails because the coupling between the ancilla and the operating qubit no longer provides a logical phase flip operation. When the ancilla qubit is not in the |1> state, the system is outside the code space.

A logical state of a logical qubit is a product of the states of the physical qubits from which the logical qubit is comprised. A logical state is a quantum basis state and, thus, a logical qubit can exist in a superposition of its logical states. So, as the logical states are quantum basis states, the logical single qubit operations may act upon logical qubits, logical two qubit operations may couple logical qubits. The initialization and measurement of logical qubits obeys the general principles of quantum mechanics.

In the present method to operate an encoded register the ancilla qubit is frozen in the |1> quantum state. Other methods practiced on other registers may require that the ancilla qubit is frozen into a different quantum state.

In accordance with an embodiment of the present invention, the operations that were previously performed on one physical qubit are replaced by encoded operations or logical operations that operate on one logical qubit, but possibly on more than one physical qubit. The logical single-qubit operations include:

$$X_i \equiv \sigma^X_{2i-1} \quad (7)$$

$$Y_i \equiv \sigma^Y_{2i-1} \otimes \sigma^Z_{2i} \quad (8)$$

$$Z_i \equiv -\sigma^Z_{2i-1} \otimes \sigma^Z_{2i} \quad (9)$$

$X_i$ acts as a logical bit-flip operation on the i-th logical qubit. Thus, $X_i$ is achieved by applying a $\sigma^x$ (bit-flip) operation to one of they physical qubits from which the i-th logical qubit is comprised, as illustrated in equation (10).

$$X_i|0_i\rangle_L = \sigma^X_{2i-1}|0_{2i-1}1_{2i}\rangle = |1_{2i-1}1_{2i}\rangle = |1_i\rangle_L \quad (10)$$

The $X_i$ operation 315 is shown in FIG. 3A. In this example it is applied to logical qubit 4-4 (i=4), and therefore to operating qubit 7 (2i−1=7).

Additionally, the $Z_i$ operation acts substantially simultaneously on the operating qubit (2i−1) and an ancilla qubit 2i as an encoded bias operation on the 4-i-th logical qubit. $Z_i$ acts as a logical phase-flip operation on the i-th logical qubit, e.g., achieved by applying a $\sigma^z$ (phase-flip) operation, as shown in equations (11a, b).

$$Z_i|0_i\rangle_L = -\sigma^Z_{2i-1} \otimes \sigma^Z_{2i}|0_{2i-1}1_{2i}\rangle = |0_{2i-1}1_{2i}\rangle = |0_i\rangle_L \quad (11a)$$

$$Z_i|1_i\rangle_L = -\sigma^Z_{2i-1} \otimes \sigma^Z_{2i}|1_{2i-1}1_{2i}\rangle = -|1_{2i-1}1_{2i}\rangle = -|1_i\rangle_L \quad (11b)$$

By "substantially simultaneously" it is meant that the operation of $Z_i$ on the operating qubit, and on the ancilla qubit occurs at approximately the same time, but the operation need not start or end at the same time for both qubits. An example of the $Z_i$ operation 310 is shown in FIG. 3A. In this example, it is applied to logical qubit 4-3 and therefore to operating qubit 2i−1=5 and ancilla qubit 2i=6.

Together, the $X_i$ and the $Z_i$ operations make all the encoded single qubit operations possible. The $X_i$ operation is an encoded bit flip operation while $Z_i$ is an encoded single logical qubit bias operation. These operations generate the group SU(2) for a logical qubit. The qubit biasing is possible because the ancilla qubits in the |1> state, and the phase coupling term, provide an adequate biasing method for the operating qubits.

As discussed hereinabove, there are many different approaches for operations based on two logical qubits. An example is the controlled phase operation, a two qubit operation shown in equation (12).

$$H^{CPHASE}_{i,i+1} = J_{2i-1,2i+1}\sigma^Z_{2i-1} \otimes \sigma^Z_{2i+1} \quad (12)$$

The CPHASE gate is generated by the controlled phase operation. In the present implementation of the CPHASE gate, only odd-numbered physical qubits are involved. Referring to FIG. 3A the controlled phase operation 305 is shown for the case of logical qubits i=4-1 and 4-2, and operating qubits 1 and 3.

The single logical qubit operations, $X_i$ and $Z_i$, and the two logical qubit operation, $H^{CPHASE}$, provide a possible set of operations that are sufficient to generate the $SU(2^N)$ group, i.e., that are sufficient to perform all of the complex operations required to make the quantum computer universal. The operations of 305, 310, and 315 may be performed on a wide variety of quantum registers such as the later illustrated registers 301, 400, and 401.

The logical ay operation, $\sigma^Y$, is not shown in FIG. 3 because the quantum register 200 as described does not have a $\sigma^Y$ term in its Hamiltonian. However, it is consistent with embodiments of the present invention that $Y_i$ can be implemented if the Hamiltonian contains a $\sigma^Y$ term.

Second Design with Ancilla Qubits

Figure 4A:
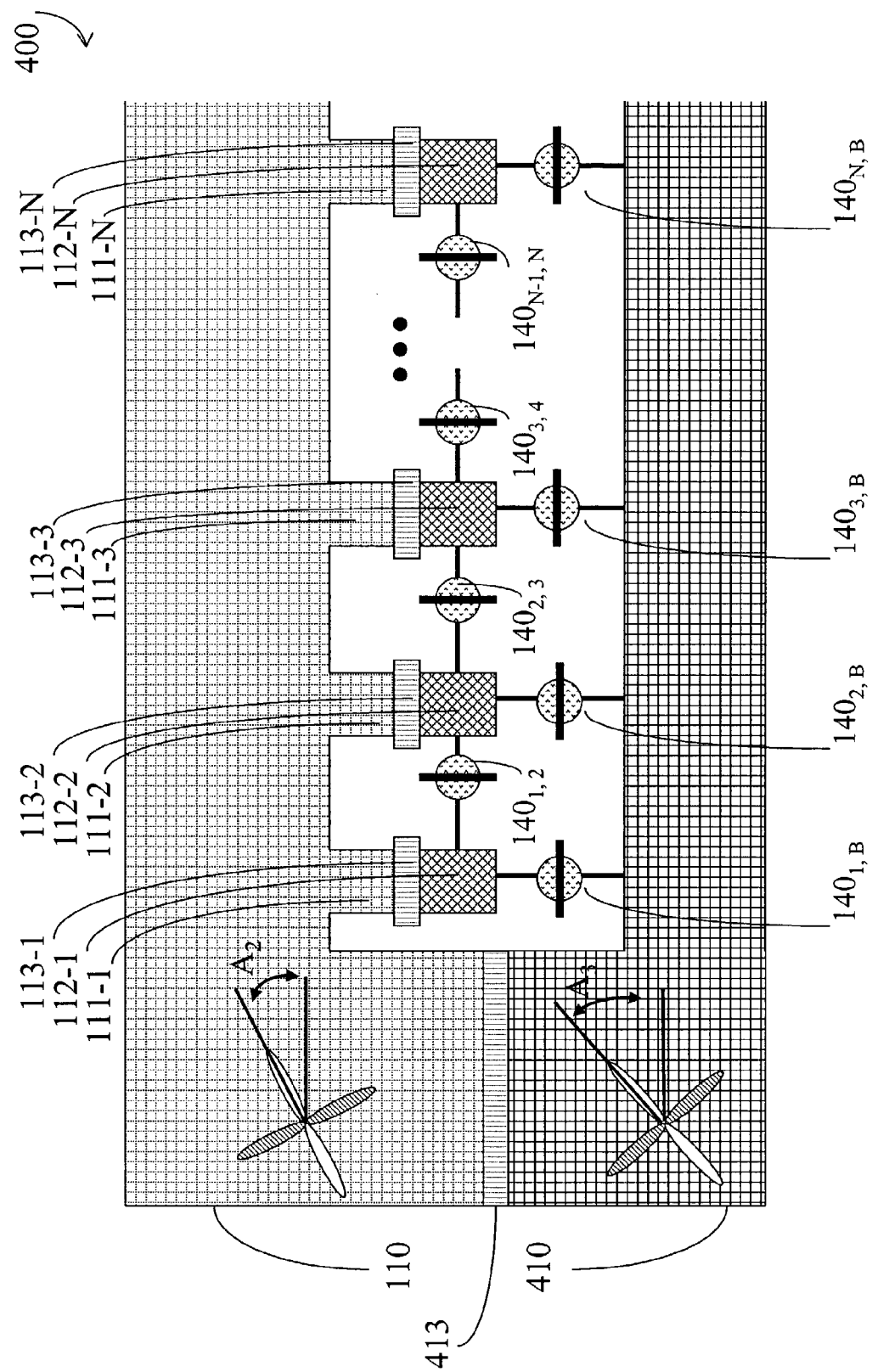
FIGS. 4A-B illustrate registers with bus qubits.

FIG. 4A illustrates a quantum register 400 according to an aspect of the present invention. In this embodiment, the N even numbered ancilla qubits are replaced by a bus 410. The bus can have a spatial extent of many qubits. Primarily because of the large spatial extent of the bus, the phase of the order parameter of the bus stays substantially constant in time. Thus, suppression of the dynamics of the ancilla qubit can be achieved efficiently. In addition, it is much easier to fabricate the quantum register according to this embodiment, because it requires the formation of N physical qubits and a bus, instead of the 2N physical qubit design of FIGS. 2C and 2D. The rest of the design in FIG. 4A is analogous to the design of FIGS. 2C and 2D. Thus the register of FIG. 4A includes a bank of superconducting material 110, operating qubits formed from operating fingers 111-i, operating mesoscopic islands 112-i connected by operating Josephson junctions 113-i, as well as the switchable operating couplings indexed as 140-i,(i+1). The switchable ancilla couplings provide coupling between the operating qubits and the bus 410, and are indexed as 140-i,B.

An additional qubit is formed from the superconducting bus 410, the operating bank 110, and the Josephson junction 413 between them. The phase of the order parameter of the operating bank 110 makes an angle $A_2$ with a preselected crystallographic axis, and the phase of the order parameter of the bus 410 makes an angle $A_3$ with the same axis. Hence the phase difference across the junction 413, $(A_3-A_2)$, is largely determined by the orientation of the crystallographic axes of the operating bank 110 and the bus 410.

Third Design with Ancilla Qubits

Figure 4B:
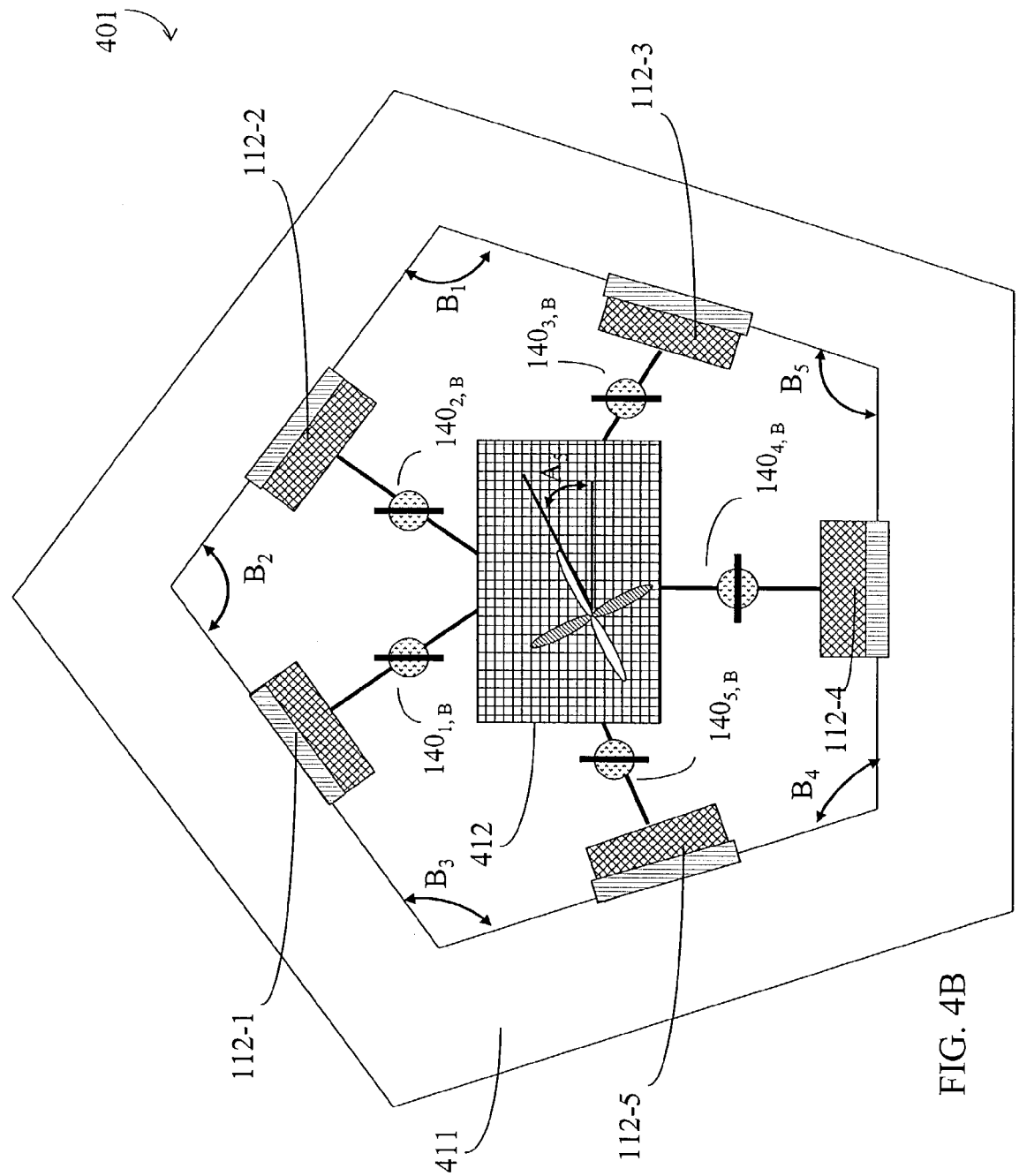

FIG. 4B illustrates another embodiment of the present invention wherein an operating superconducting bank 411 has a non-linear layout. In the illustrated embodiment, the operating superconducting bank 411 takes the shape of a polygon with five vertices, and the angle between the neighboring sides i and (i+1) of the polygon is $B_i$. Many analogous designs are possible, including polygons with any number of vertices, as well as circular and modified circular layouts.

Current biepitaxial techniques are capable of forming an N-sided polygonal aperture or opening in the bank. Such techniques can also form a N-sided, polygon, irregular or regular, or an open polygon, i.e., one missing a side. Polygonal shapes have N internal angles, $B_i$, between adjacent edges, wherein the integer i takes values between 1 and N. In FIG. 4B, N=5. As would be understood by one of ordinary skill in the art, the number of angles depends on the range of seed layers available for the utilized materials of the substrate and the superconducting bank 411. The method of using seed layers to create Josephson junctions has been described, for example, by S. Nicoletti, H. Moriceau, J. C. Villegier, D. Chateigner, B. Bourgeaux, C. Cabanel and J. Y. Laval in "Bi-epitaxial YBCO grain boundary Josephson junctions on $SrTiO_3$ and sapphire substrates," Physica C, Vol. 269, pp. 255-267 (1996), both incorporated herein by reference in their entirety. In some embodiments, quantum registers with polygonal design can be arranged into arrays wherein a physical qubit in one register couples to a physical qubit in another register.

In the example of FIG. 4B, there are no operating fingers, but such fingers can be present in related designs. The operating qubits are formed on the sides of the polygon, coupling mesoscopic islands 112-i to the operating superconducting bank by Josephson junctions. In this design, the bus 412 is positioned substantially in the center of the polygon, by which it is meant that at least some part of the bus 412 overlaps the centroid of the polygon.

Many designs exist that are analogous to the illustrated encoded quantum registers. One of their features is that a central element of the register, i.e., nearby each operating qubit, provides an ancilla, or multiple ancilla, qubits for the operating qubit, and encoded qubits. In some embodiments, the ancilla qubit, is formed in an integrated way, for example, as a bus. For example, there could be one ancilla qubit that is distinct from the bus but interacts with the operating qubits by way of a bus. For examples of structures that can form buses in superconducting quantum computers, see A. Blais, A. Maassen van den Brink, and A. M. Zagoskin, "Tunable coupling of superconducting qubits", Phys. Rev. Lett., Vol. 90, 127901 (2003), and U.S. patent application Ser. No. 10/121,800. Furthermore, the aspects of the present invention are applicable to any general physical design for phase qubits. These have been described, for example, in U.S. Pat. No. 6,504,172 B2 entitled "Superconducting Dot/Anti-Dot Flux Qubit Based On Time Reversal Symmetry Breaking Effects," to Zagoskin et al.

FIG. 3B shows embodiments of one and two qubit operations for embodiments of the present invention that contain a bus qubit. These include the single logical qubit operations $X_i$ and $Z_i$. The $X_i$ operation 315 is shown in FIG. 3B. In this example it is applied to logical qubit 4-4 (i=4), and therefore to operating qubit $(2i-1)=7$. The $Z_i$ operation acts on the operating qubit $(2i-1)$ and an ancilla qubit, in this case the bus qubit B as an encoded bias operation on the 4-$i^{th}$ logical qubit. An example of the $Z_i$ operation 310 is also shown in FIG. 3B. In this example, it is applied to logical qubit 4-3 and therefore to operating qubit $2i-1=5$, and the bus qubit B. The controlled phase operation 305 is also shown in FIG. 3B, for the case of logical qubits 4-1 and 4-2, and operating qubits 1 and 3. The operation 305 does not involve the bus qubit.

Refocusing Qubits

As described hereinabove, in embodiments where the dynamics of the ancilla qubit are partially suppressed, i.e., the qubit is not frozen into a selected quantum state, the quantum state of the ancilla qubit is refocused. Refocusing can include methods such as recoupling, encoded selective recoupling, and dynamic decoupling or "Bang Bang". Embodiments of such techniques are presented hereinbelow. Some embodiments, for example those dealing with "leakage", include the use of refocusing techniques to maintain the code space of the logical qubits. Other techniques are used to correct errors that occur while quantum information processing is performed on an encoded register in accordance with embodiments of the present invention, for example "encoded error correction". The general process of refocusing is described with reference to FIG. 5A. While the given embodiments of an encoding scheme and physical layouts capture the operation of encoded universal quantum computation, unwanted logical operations can occur during these same operations in the register. In the idle state, each physical qubit can undergo $\sigma^X$ operations. In the case of quantum registers 100 or 200, examples of such operations are Rabi oscillations which, as is understood by one of ordinary skill in the art, are sinusoidal oscillations between one state and another. Therefore the unwanted evolution of the passive qubits that are not involved in the logical operations has to be compensated.

Refocusing generally includes the following approaches. First, the dynamics of the quantum state can be suppressed partially or completely. Complete suppression is sometimes referred to as "freezing" the state of a qubit. Second, the state of the qubit that evolved in an unwanted way can be reconstructed by use of a "recoupling" scheme. A recoupling is a conversion of one type of operation into another. Recoupling can be achieved, for example, by recoupling pulses, an approach that will be referred to as "encoded selective recoupling" in the context of superconducting quantum registers.

Figure 5A:
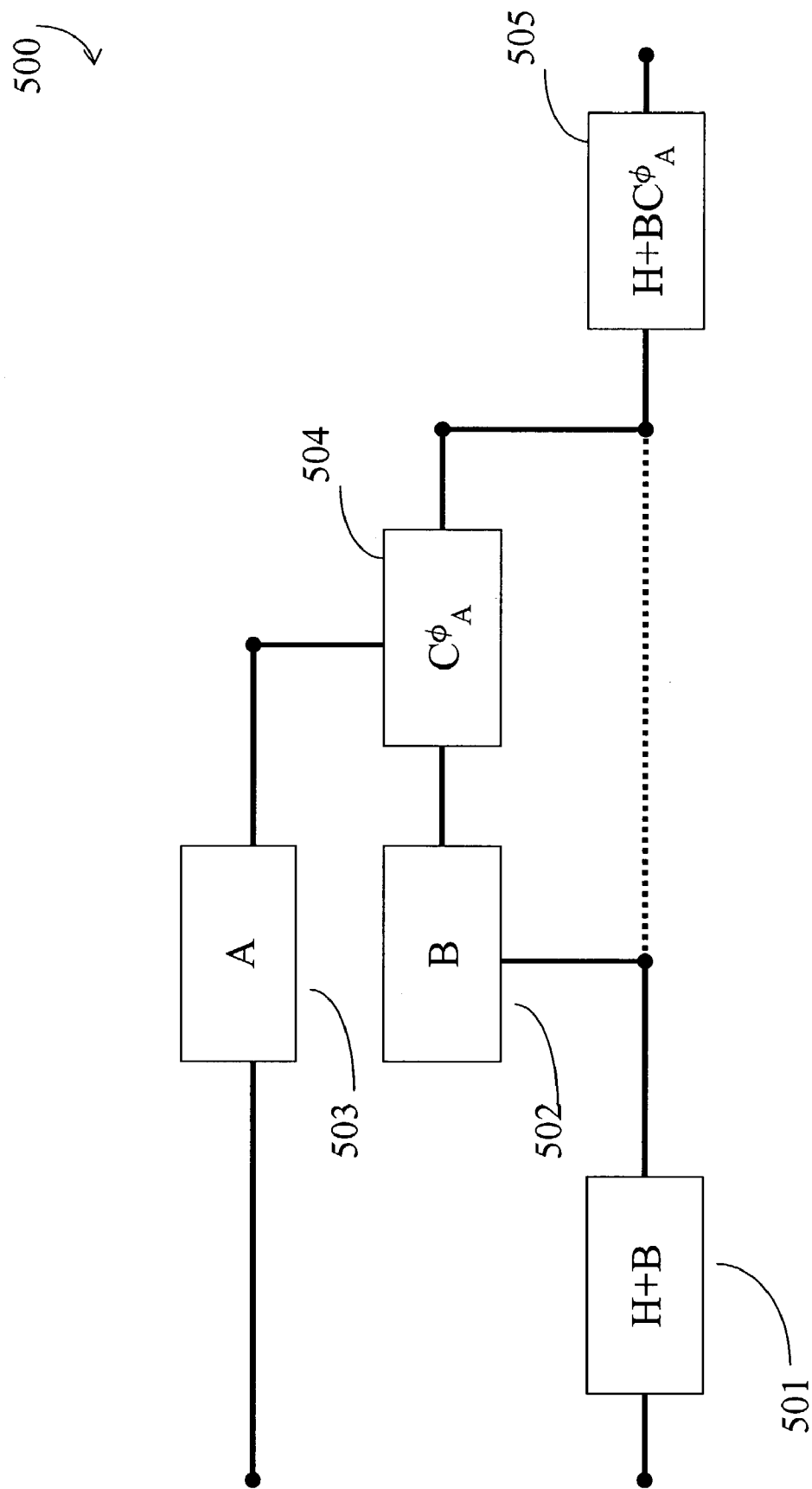
FIGS. 5A-5E illustrate processes for controlling the state evolution of a register.

Encoded selective recoupling is based on equation 13, hereinbelow, and is illustrated in FIG. 5A. Starting in step 501 the Hamiltonian of the system is divided into its desired and undesired components, labeled H and B, respectively. The B term is the error term, corresponding to the physical interaction of the register with its environment or with itself. In accordance with the given embodiments of the present invention the error term is expressed as a weighted sum of one and two qubit operators. In step 502, the error term is determined. The recoupling pulse for B, here labeled A, is determined in step 503. The recoupling pulse is based on the available controllable interaction, such as qubit tunneling or qubit coupling, in many of the embodiments of the present invention, as illustrated by the quantum registers 100, 200, 400, and 401. In such registers, the interaction is the Josephson coupling, proportional to $\sigma_i^z \sigma_j^z$, or the tunneling.

The error term B is "conjugated by A" in step 504, as further described hereinbelow. Step 504 involves a suitably chosen angular parameter $\phi$, whose function is also explained hereinbelow. The act of conjugation by A physically corresponds to letting the interaction represented by the operator A act on the system for a specific amount of time described hereinbelow. The result of the process is seen in step 505 whereby the system had its error term conjugated by A. This method can be used on the encoded (logical) qubits, and is therefore an example of "encoded selective recoupling".

An additional embodiment of process 500 is simply the option of not applying the process at all. Therefore an optional element of 500 is a null process which has been found to be useful in, for example, encoded error correction.

The process 504 of FIG. 5 known as conjugation by A, is modeled as follows. Let A and B be anticommuting Hermitian operators where $A^2=I$. One reason for this choice is that the Pauli matrices are anticommuting Hermitian operators. Then, the operation is:

$$C_A^\phi \circ \exp(i\theta B) \equiv \exp(-i\phi A)\exp(i\theta B)\exp(i\phi A) = \quad (13)$$
$$\begin{cases} \exp(-i\theta B) & \text{if } \phi = \pi/2 \\ \exp(-i\theta(iAB)) & \text{if } \phi = \pi/4 \\ \exp(i\theta B(I+iA)/\sqrt{2}) & \text{if } \phi = \pi/8 \end{cases}$$

The result of equation 13 with $\phi=\pi/2$ is used in the NMR technique of refocusing, or more generally, selective recoupling. It allows one to flip the sign of a term in a Hamiltonian, which can be used to cancel unwanted evolution. In such a situation, the error that is expressed in the operator B is cancelled out by applying the refocusing pulse, A.

The result with $\phi=\pi/4$ is a rotation, specifically a special case of Euler angle rotations which preserves a discrete symmetry group (commonly the Pauli group in quantum computation). It is another, and in some examples optional, operation that affords universal computation i.e. generates the group SU(2).

The case where $\phi=\pi/8$ is the so called $\pi/8$ gate. The $\pi/8$ gate allows for the algebra to be based on the Pauli group algebra as well as providing a specific rotation. This gate combined with the HADAMARD gate and CNOT can approximate to arbitrary accuracy any quantum circuit. Additionally, these gates are the basis of fault-tolerant quantum computing, see, e.g., Michael A. Nielsen and Isaac L. Chuang, *Quantum Computation and Quantum Information*, Cambridge Univ. Press, (2000).

In order to implement $e^{-itA}$, a necessary operation in step 504 of process 500 wherein A is a Hamiltonian that is turned on for a time t, we need to find $v$ such that $e^{ivA}=I$ and implement $e^{i(v-t)A}$ instead. For example, if $A=J_{12}\sigma_1^z\sigma_2^z$, we have $v=2\pi/J_{12}$, so that $\exp(-it(-J_{12}\sigma_1^z\sigma_2^z)=\exp(i(t-2\pi/J_{12})J_{12}\sigma_1^z\sigma_2^z)$. In this example, if this Hamiltonian is applied as a pulse for a duration, $t-2\pi/J_{12}>0$, the system effectively evolves as if $J_{12} \to -J_{12}$. This method circumvents the need for switching the sign of the Hamiltonian itself.

The duration of the recoupling pulse is proportional to $\theta$, nominally the angle of rotation in the Hilbert space. All encoded logical $\sigma^X$ operations must be implemented as $\exp(-iT\Delta_i X_I)$ with $T \geq T_{min}$. Here $\Delta_i$ is the energy of the i-th tunneling operation $\sigma^X$. This means that the smallest angle of rotation around the encoded x-axis is $$\theta_{min} = 2\pi\Delta_{ij}/J_{ij}^{max}.$$

If there exists a minimum angle, there is a minimum time and vice versa. For example, if $\Delta_i \sim 100$ MHz (1 MHz=$10^6$ Hertz) and $J_{ij}$ is of the order of 1 GHz (1 GHz=$10^9$ Hertz), then $\theta_{min}$ is of the order of $2\pi/10$, and can be made smaller if the coupling strength, $J^{ij}$, is made larger. The coupling strength may be increased by increasing the current capacity at the Josephson junction. Embodiments where the pulses are strong can be useful. A strong pulse is one whose magnitude is equal to or exceeds the magnitude of the other Hamiltonian components. Furthermore, as detailed in process 500, recoupling can require fast pulses as do schemes like the so called "Bang Bang" (or dynamic decoupling) methods which require fast pulses and optionally the use of the short-time approximation.

Leakage

In accordance with an embodiment of the present invention, a method for controlling the information state of the ancilla qubits includes the use of encoded selective recoupling to cancel out free evolution of the biasing qubits. In the idle state there will be tunneling on all qubits. This tunneling has the effect of implementing unwanted $\sigma^X$ operations, such as changing the state of the biasing qubit. On the biasing qubits, these bit flips cause a transition, or "leakage" out of the code space. This leakage which is due to the free evolution of these qubits during an idle period, can be eliminated by recoupling or other means to suppress the dynamics of the biasing qubits. An example of a method to correct leakage is the process outlined hereinbelow with reference to the process in FIG. 5A.

In one example of leakage, there is an unwanted $\sigma^X$ operation on the first and second logical qubits in a system described by the system Hamiltonian $H_S$. At step 502 in FIG. 5A the error term has the form $B=\Delta_2\sigma_2^X+\Delta_4\sigma_4^X$. In step 503 it can be shown that a suitable operator A for recoupling is $A=J_{2,4}\sigma_2^Z\sigma_4^Z$. Operator A is suitable because it fits the necessary and sufficient conditions of being strong, i.e., has a magnitude greater than that of B and switchable, i.e., it can be delivered in the form of pulses. By performing step 504 the sign of B will be flipped. See, e.g., D. A. Lidar, L.-A. Wu, and A. Blais, "Quantum Codes for Simplifying Design and Suppressing Decoherence in Superconducting Phase-Qubits", *Quant. Inf. Proc.*, 1, 155 (2002), which is incorporated herein by reference in its entirety. A method to achieve this in accordance with given embodiments of the present invention is to turn on A for a time $\tau_{24}$ such that $\tau_{24}J_{24}=\pm\pi/2$. Specifically, since $A=J_{2,4}\sigma_2^Z\sigma_4^Z$, and $B=\Delta_2\sigma_2^X+\Delta_4\sigma_4^X$ satisfy the conditions of equation 13 and step 504 of the process described in FIG. 5A:

$$\exp[it(\Delta_2\sigma_2^X + \Delta_4\sigma_4^X)](C_{\sigma_2^Z\otimes\sigma_4^Z}^{\pi/2} \circ \exp[it(\Delta_2\sigma_2^X + \Delta_4\sigma_4^X)]) = I \quad (14)$$

The result is the identity operation, which leaves the state unchanged so that evolution under $\Delta_2\sigma_2^X+\Delta_4\sigma_4^X$ has been eliminated.

Figure 5C:
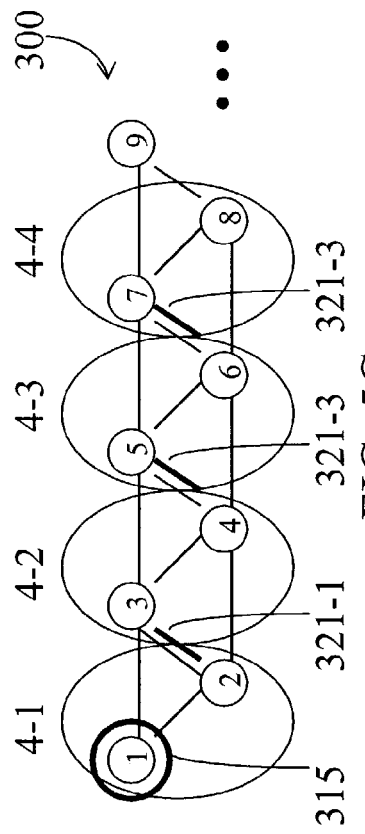
Figure 5E:
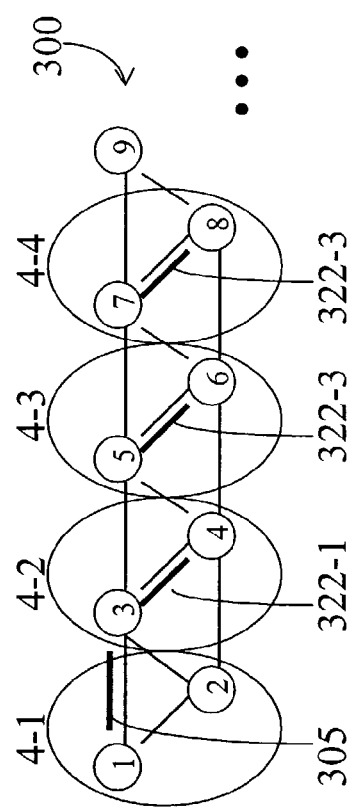
Figure 5B:
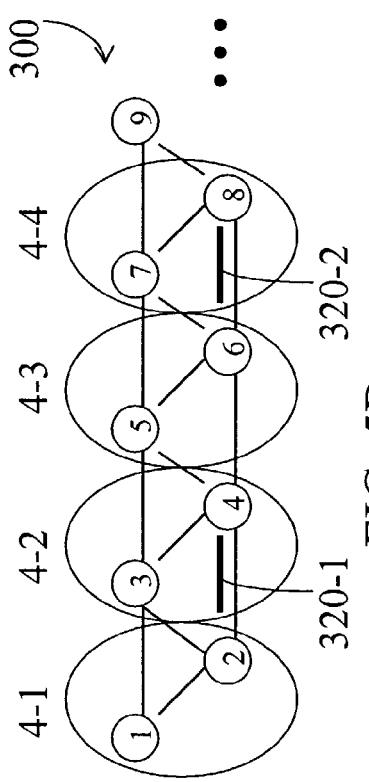

FIG. 5B illustrates an example of a method to eliminate leakage on a quantum register includes recoupling all pairs of biasing qubits 112 in FIG. 2, indexed as {(2,4), (6,8), . . . , (4i−2,4i), . . . } using a process 500. This is schematically shown in FIG. 3D with the active couplings 320 performing the recoupling. These operations must be applied all at once, or substantially simultaneously, because the evolution under the undesired Hamiltonian term cannot be symmetrically cancelled, and an error will be introduced into the computation. When all $J_{4i-2,4i}$ are rationally related, i.e., their ratio is a rational number, appropriate intervals for $\tau_{4i-2,4i}$ can easily be found. For example, setting all $J_{4i-2,4i}$ equal can accomplish this. The degree of rational relationship determines the extent of refocusing for the register and therefore is a predetermined element of choice for the implementers of embodiments of the present invention.

Preserving Code Space Under Xi, Zi and ZiZj Operations

In accordance with an embodiment of the present invention, a mechanism for controlling the information state of passive qubits during operation includes the use of encoded selective recoupling on passive qubits. This extends the example given hereinabove beyond leakage out of the code space, to errors due to tunneling of passive qubits during operation of encoded single qubit gates on active qubits. Examples of such a procedure include recoupling passive qubits in the presence of $X_i$, $Z_i$ and $Z_iZ_j$ operations.

For example, while the logical bit-flip operation ($X_i$) for an active logical qubit i, $$X_i = \sigma_{2i-1}^X,$$

is performed, additional undesired tunneling occurs on all other passive physical qubits other than qubit 2i−1, thus implementing unwanted $\sigma^X$ operations. Passive qubits are those physical qubits not involved in the logical bit flip operations, in this case physical qubits other than qubit 2i−1. To emphasize this, the tunneling component of the system Hamiltonian can be expressed as: $H_X=H_O+E+\Delta$ where $H_O$ is the desired evolution, E is the error, for example erroneous bit flips on the passive qubits, and $\Delta$ is a leakage term. Similarly, while the encoded $\sigma^Z$ for the $i^{th}$ qubit, $Z_i$, is on, we have tunneling in all physical qubits other than 2i−1 and 2i. To eliminate this effect it is possible to either implement computational operations on the other logical qubits say an operation that commutes with $X_i$ (or $Z_i$) on the $j^{th}$ qubit (j≠i). It is also possible to eliminate this unwanted evolution via a method such as recoupling.

FIG. 5C shows an embodiment of the first method to control unwanted evolution on the passive qubit while a logical bit-flip operation is performed on the $i^{th}$ active qubit. It is desirable to eliminate not just the leakage term $\Delta$, but also the unwanted logical operations E. As a further example, consider implementing $X_1$ for a time T, i.e., evolution under $\exp(-iT\Delta_1X_1)$. The solution is shown schematically in FIG. 5C. Where $X_i$ with i=1, operation 315 is shown with recouplings 321-1, 321-2, 321-3, etc. In the given embodiment of a quantum register the recoupling 321 involves the physical qubits indexed as {(i,j)}={(2,3),(4,5), (6,7),(8,9), . . . }, using the same procedure outlined in FIG. 5A. Namely, the interaction $\{\sigma_i^z\sigma_j^z\}$ is turned on for times $\tau_{ij}$, $\tau''_{ij}$ such that $\tau_{ij}J_{ij}=\pi/2$ and $\tau''_{ij}J_{ij}=3\pi/2$. In between and after the $\pi/2$ and $3\pi/2$ periods these pairs of qubits are allowed to evolve freely for times $\tau'_{ij}$ under the tunneling terms $\Delta_i$, and $\Delta_j$. The condition that must then be satisfied is: $\tau_{ij}+2\tau'_{ij}+\tau''_{ij}=T$. Since, e.g., $\tau_{23}J_{23}=\pi/2$, the free evolution time is determined by $\tau'_{23}=T/2-\pi/J_{23}$, or, in general: $\tau'_{ij}=T/2-\pi/J_{ij}$. These times must be positive, so that we must be able to make $J_{ij}$ (assuming it is positive) large enough that $J_{ij}>2\pi/T$. Conversely, if $J_{ij}$ has a maximum value $$J_{ij}^{max}$$

then there is a time $$T_{min} = 2\pi / J_{ij}^{max}$$

to below which we cannot apply an encoded logical $\sigma^X$ operation. In a preferred embodiment of the present invention, all encoded logical $X_1$ operations are implemented as $\exp(-it\Delta_1X_1)$ with $T \geq T_{min}$, but the magnitude of $J_{ij}$ is dictated by the embodiment of the invention.

Figure 5D:
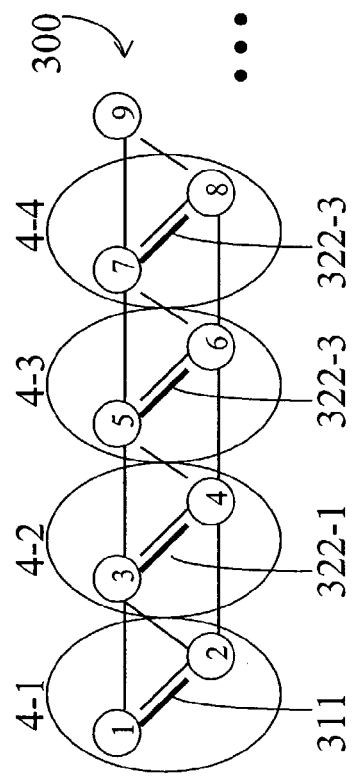

FIG. 5D shows a method to control error during a logical phase flip operation 311 for the $i^{th}$ qubit, $Z_i$, in the presence of tunneling on all other qubits. This method is similar to that of single encoded bit flip operation. Consider the following Hamiltonian: $H_{Zi}=J_iZ_i+H_{EX}+\Delta$ where $J_iZ_i$ is the desired evolution, $H_{EX}$ is the error, and $\Delta$ is a leakage term. In continuation of this example implement $Z_1=\sigma_1^Z\sigma_2^Z$ for a time T, i.e., the operation $\exp(-it\,J_1Z_1)$. The solution is shown schematically in FIG. 5D where the example with operation $Z_1$ and recoupling 322 are shown. The recoupling is performed in a similar manner to process 500 in FIG. 5A. For the given example of a quantum register the recoupling of all other qubits is in pairs indexed {(i, j)}={(3, 4), (5, 6), (7,8), (9,10), . . . } by again turning on the interactions $\{\sigma_i^z\sigma_j^z\}$ for times $\tau_{ij},\tau''_{ij}$ such that $T_{ij}J_{ij}=\pi/2$ and $\tau''_{ij}J_{ij}=3\pi/2$. All other details are the same as hereinabove.

FIG. 5D shows an additional example of control of information of passive qubits for the given operations that make up the universal set. Consider unwanted bit-flip operations ($\sigma^X$) during $Z_iZ_j$ or controlled phase operation 305. The solution is the same as prescribed above as outlined in FIG. 5A. The relevant components of the system Hamiltonian are detailed as $H_{ZiZi+1}=J_{2i-1,2i+1}Z_iZ_{i+1}+H_{EX}+\Delta$. The solution is completely analogous to the case of the logical phase-flip operation including the indices of which physical qubits are refocused. See recouplings 322-1, 322-2, 322-3, etc., in FIG. 5D.

The given examples of physical layout 200 and variations, encoding scheme and selective encoded recoupling can be incongruous. Specifically refocusing 321 in FIG. 3E in the encoded $\sigma^X$ case requires pairing up N−1 physical qubits, whereas the recoupling 322 in the single encoded $\sigma^Z$ and encoded $\sigma^Z\sigma^Z$ cases requires pairing up N−2 physical qubits. Thus in the former case when recoupling is performed, N should be odd, while in the latter N should be even to ease implementation of recoupling.

In view of such a contradictory requirement N can be consider to be even without loss of generality as additional embodiments of a register can handle the recoupling of N−1 pairs. An example of how N−1 pairs can be refocused is reintroduce single-qubit $\sigma^z$ operations on one (or a small number of) qubit(s) for example the last physical qubit. This physical qubit can then be refocused independently.

In accordance with an embodiment of the present invention, an additional example of a structure and a method to refocus N−1 pairs of qubits is to make the coupling energy of all physical qubits much larger than the tunneling matrix element. In the examples presented herein, the coupling energy is the Josephson coupling. It is then possible to neglect the evolution of the passive qubits due to tunneling during the on-time of the Josephson coupling on the active qubit. The condition that the coupling term be much larger, about ten times greater, than the magnitude of the tunneling term for all qubits must be reached for this solution to be readily applicable.

In accordance with an embodiment of the present invention, an additional solution is to fix one (or a small number of) physical qubit(s), for example the last qubit in 400 (indexed as 2N) in the |1> state. This corresponds to producing that qubit with a very high tunneling barrier and initializing it in the |1> state. In this manner this qubit is 'frozen' and recoupling is not required. For a given embodiment of the present invention, producing a qubit with a high tunneling barrier can be achieved by altering the physical parameters of the qubit. For example, in the case of the register 100 in FIG. 1, many options exist such as altering the misalignment between the bank 110 (or 210), and the mesoscopic islands 112 to suppress tunneling, see U.S. Pat. No. 6,459,097 B1 entitled "Qubit using a Josephson Junction between s-Wave and d-Wave Superconductors," to Zagoskin, col. 10, line 31 et seq., incorporated herein by reference. This can be done experimentally by well known bicrystal or biepitaxial techniques. See, for example, E. Il'ichev, M. Grajcar, R. Hlubina, R. P. J. IJsselsteijn, H.E. Hoenig, H.-G. Meyer, A. Golubov, M. H. S. Amin, A. M. Zagoskin, A. N. Omelyanchouk, and M.Yu. Kupriyanov, "Degenerate Ground State in a Mesoscopic $YBa_2Cu_3O_{7-x}$ Grain Boundary Josephson Junction", Physical Review Letters, Vol. 86, pp. 5369-5372 (2001); and F. F. Tafuri, F. Carillo, F. Lombardi, F. Miletto Granozio, F. Ricci, U. Scotti di Uccio, A. Barone, G. Testa and E. Sarnelli and J. R. Kirtley, "Feasibility of biepitaxial $YBa_2Cu_3O_{7-x}$ Josephson junctions for fundamental studies and potential circuit implementation," Physical Review B, Vol. 62, pp. 14431-14438, (2000), respectively, each of which is incorporated herein by reference its entirety. Alternatively, junction 113 can be made larger, for instance as much as about 5-100 times increase in width, compared to the other junctions and thereby freezing or at least suppress tunneling on the associated qubit.

Additional embodiments of the present invention may include greater use of the concept of "frozen" qubits. For example, all biasing qubits such as the line of qubits 226 in FIG. 2C could be made frozen. If there are no dynamics of the biasing qubits then it is possible to have no leakage out of the code space.

Encoded Error Correction

In addition, efficient error correction methods can be practiced in the structure of the present invention.

In accordance with an embodiment of the present invention a process for correcting errors associated with the "bath", or environment, involves multiple rotations and recoupling. This encoded error correction decouples the qubit or register from the environment in order to correct and protect against errors associated with the bath or decoherence. One view of decoherence is that it is the process of altering the quantum mechanical phase of a quantum system such as a qubit. An example of decoherence includes the situation where unitary evolution, i.e., phase and superposition preserving evolution, no longer describes the evolution of the qubit.

Embodiments of the present invention may include the use of single qubit biasing to perform encoded error correction to protect against decoherence. Additional embodiments of the present invention include the use of encoded single qubit operations to perform encoded error correction. It is possible by use of the method described in relation to equation 13, and process 500 from FIG. 5A, to decouple and cancel the system-bath interaction component of the total Hamiltonian. The total Hamiltonian of a qubit and bath system can be written as $H=H_S+H_B+H_{SB}$. In this Hamiltonian, $H_S$ is the system Hamiltonian, the forms of which include those of the given embodiments of the present invention, $H_B$ is the Hamiltonian of the bath, and $H_{SB}$ is the system-bath interaction or coupling term. The ability to carry out error correction rests on the assumption that $H_S$, or part of it, is so strong that we can make $H \approx H_S$.

Figure 6:
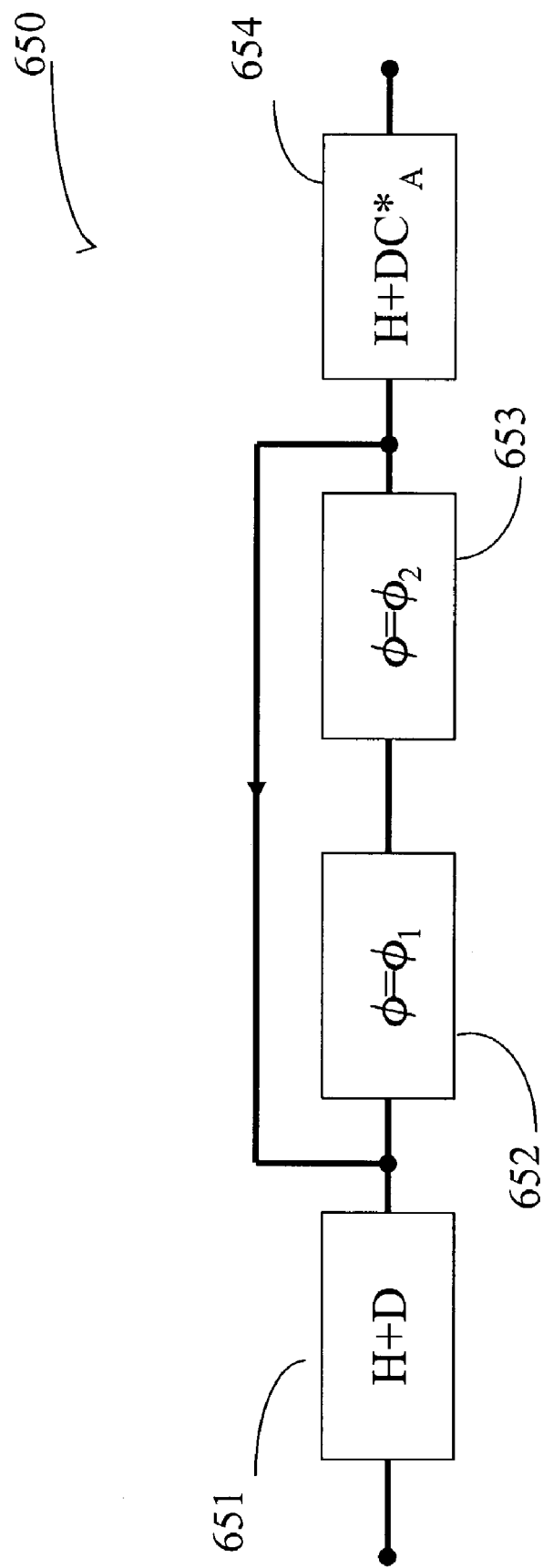
FIG. 6 illustrates error correction operations.

FIG. 6 illustrates process 650, an embodiment of an encoded "Bang Bang" method. Step 651 is where the Hamiltonian of a system is divided into component H, not to be corrected, and D, to be corrected. Next, in step 652, a variant of process 500 of FIG. 5A that uses fast pulses, is applied with the angle parameter being $\phi=\phi_1$, for example, $\phi=\pi/2$. In step 653, a similar process is applied again with the angle parameter being $\phi=\phi_2$, for example, $\phi=\pi/2$. Steps 652 and 653 can be repeated to improve the correction of errors. In step 654, the evolution under D has been eliminated. The error correction method 650 includes the use of pulses with a periodicity that can be shorter than the bath correlation time. Equivalently the periodicity can be a time less than the inverse of the highest frequency oscillator used to model the bath. The process 650 can further include the use of pulses that are modeled using a short-time approximation for the expansion of an exponential sum of non-commuting operators. Examples of process 650 applied to a quantum register are given below.

The interaction term $H_{SB}$ can be modeled with a Hamiltonian of the form $$\sum_i \vec{\sigma}_i \cdot \vec{B}_i,$$

where $\vec{\sigma}_i$ is a vector of Pauli matrices acting on the system, and $\vec{B}_i$ are the corresponding bath operators. This can represent the interaction of a qubit with a fluctuating field. For example, for a superconducting qubit, a term $\sigma_i^z B_i^z$ arises due to fluctuations of the local magnetic field. The relation of HSB to parameters of the system and bath has been analyzed in detail see Y. Makhlin, et al., "Quantum-State Engineering with Josephson-Junction Devices", Reviews of Modern Physics, Vol. 73, p. 357 (April 2001), incorporated herein by reference.

In accordance with the given embodiments of the present invention, the following assumptions are made, by way of illustration and not limitation, $|J_{ij}|>>|\Delta_i|>>|B_i^X|, |B_i^Y|, |B_i^Z|$, so that the strong parts of $H_S$ are $H_{ij}=J_{ij}\sigma_i^z\sigma_j^z$, which may be turned on and off freely. Embodiments of encoded error correction can be performed when no symmetry in the system-bath interaction exists, i.e., the case of an arbitrary system bath interaction Hamiltonian $H_{SB}=$ $$\sum_i \vec{\sigma}_i \cdot \vec{B}_i.$$

Unlike the cases where axial symmetry in HSB exists, see below, a method to eliminate HSB can include the short-time approximation, i.e., pulses that are modeled using a short-time expansion of an exponential of sums of non-commuting operators. FIG. 6 illustrates method 650 whereby system bath interaction can be eliminated.

In the example of an arbitrary system bath Hamiltonian, given hereinabove, process 650 can also be applied to a quantum register. The short-time approximation implies that $$e^{i(A+B)} = \lim_{n\to\infty}(e^{iA/n}e^{iB/n})^n = e^{iA/n}e^{iB/n} + O(n^{-2}) \tag{15}$$

The definition of short-time is obtained from equation 15 which is valid to first order within a short-time. However, as the pulses used in process 650 are fast, the short-time approximation can be invoked without loss of generality. With the given embodiments of the present invention, and assuming no symmetry in $H_{SB}$, in the situation where $D=H_{SB}$, the exponentiated form of D over a short-time is:

$$e^{-iH_{SB}t/n} = \prod_{i=1}^{N} e^{-i\sigma_i^X B_i^X t/n} e^{-i\sigma_i^Y B_i^Y t/n} e^{-i\sigma_i^Z B_i^Z t/n} + O(n^{-2}) \tag{16}$$

Equation (16) contains the Pauli Matrices $\sigma^X$, $\sigma^Y$, $\sigma^Z$, and the associated bath operators. In step 652 the register can be partly decoupled from this system bath interaction using the Josephson interaction. First, by applying a fast and strong pulse of the Josephson coupling using process 500 with $A=\sigma^Z\sigma^Z$, the exponentiated form of D over a short-time, and $\phi=\pi/2$:

$$C_{\sigma_i^Z \otimes \sigma_{i+1}^Z}^{\pi/2} \circ \left(e^{-i\sigma_i^X B_i^X t/n} e^{-i\sigma_i^Y B_i^Y t/n} e^{-i\sigma_i^Z B_i^Z t/n}\right) = e^{i\sigma_i^X B_i^X t/n} e^{i\sigma_i^Y B_i^Y t/n} e^{-i\sigma_i^Z B_i^Z t/n} \tag{17}$$

After completing an application of step 652 of method 650 for an example of an interaction term, the resultant evolution is:

$$e^{-iH_{SB}t/n} = \left[C_\Xi^{\pi/2} \circ e^{-iH_{SB}t/n}\right] = e^{-i\sum_i \sigma_i^Z B_i^Z t/n} + O(n^{-2}) \tag{18a}$$

$$\Xi = \sum_{i=1,3,\ldots}^{N-1} \sigma_i^Z \otimes \sigma_{i+1}^Z \tag{18b}$$

Therefore, for this illustration, the system evolution will now be, in the highest order, a Hamiltonian consisting of a weighted sum of $\sigma^Z$. Had the pulse A consisted of other than Josephson coupling, the result from step 652 would be a weighted sum including other Pauli matrices.

Having completed step 652, step 653 is applied to the given example. The remaining term can be decoupled using the tunneling Hamiltonian. Applying process 500 where the recoupling pulse is $A=\sigma^X$, the undesired exponentiated Hamiltonian $$e^{-i\sum_i \sigma_i^Z B_i^Z t/n},$$

is eliminated; here $\phi=\pi/2$:

$$e^{-i\sum_i \sigma_i^Z B_i^Z t/n} \left[C_\Xi^{\pi/2} \circ e^{-i\sum_i \sigma_i^Z B_i^Z t/n}\right] = I + O(n^{-2}) \tag{19a}$$

$$\Xi = \sum_i^N \sigma_i^X \tag{19b}$$

The result is step 654 where D in the first order term is the identity matrix and therefore has been eliminated by the multiple applications of steps 652 and 653. Again, this procedure requires fast pulses. However, this example illustrates that some encoded error correction can be performed without using more resources than are required for computation.

Embodiments of the present invention can include the use of encoded error correction techniques that exploit, where present, symmetry of the system bath interaction. Examples of these symmetries include the cases with an axial symmetry in the XY or YZ planes of the Hilbert space. Still other examples of encoded error correction include fast pulses but not short-time approximation.

In accordance with given embodiments of the present invention, the assumption that $|J_{ij}| \gg |\Delta_i|, |B_i^X|, |B_i^Y|, |B_i^Z|$ so that the strong parts of $H_S$ are the terms $H_{ij}=J_{ij}\sigma_i^Z\sigma_j^Z$, (which may be turned on and off freely), provides an illustrative example of encoded error correction. If $H_{SB}$ is of the general form, $\Sigma_i \vec{\sigma}_i \cdot \vec{B}_i$, then $H_{ij}$ is not enough to eliminate $H_{SB}$ by decoupling methods, since it commutes with the $\sigma_i^Z B_j^Z$ terms. However, if the system-bath interaction has an "axial symmetry" so that $H_{SB}=\Sigma_i (\sigma_i^X B_i^X \sigma_i^Y B_i^Y)$, it can be eliminated by encoded selective decoupling. In accordance with an embodiment of process 650, $H_{SB}$ is labeled B for step 651, analogously to examples above. Here, $A=\sigma_{2m-1}^Z\sigma_{2m}^Z$ (i.e., encoded $\sigma_i^Z$ or $Z_m$), and $\phi=\pi/2$ in step 652. The application of 653 is a null process, i.e., not applying process 652, and interaction does not occur. Again, implicit is the assumption that $H_{SB}$ is negligible while A is on. To the extent that this assumption breaks down, there will be an error proportional to the ratio of the largest eigenvalue of $H_{SB}$ by the smallest eigenvalue of $H_S$. These parameters, the largest eigenvalue of $H_{SB}$, and the smallest eigenvalue of $H_S$, are controllable in qubit design. This type of axially symmetric system-bath interaction can be suppressed without any extra resources, simply by using the already available Josephson coupling or an available switchable two qubit operation. Examples of extra resources that may be used herein include extra qubits (i.e., extra two-level quantum systems), or introducing extra degrees of freedom into the existing qubits, for example, by changing to quantum systems with more than two levels, also known as d-bits.

Furthermore, the decoupling pulse A used in the example of error suppression under an axial symmetric system bath interaction, as described hereinabove, commutes with all $Z_{m'}$, $Z_m Z_{m''}$ and with all $X_m$, such that m', m"≠m. All of these logical operations can therefore be executed in parallel with this decoupling procedure. However, since the decoupling pulses anticonimute with $X_m$, this logical operation can be eliminated if it is turned on during decoupling. Hence the suppression of decoherence on the $m^{th}$ qubit must be alternated with the logical $\sigma_X$ operations on it. This implies that this qubit will suffer some decoherence while the logical $\sigma_X$ operations are applied to it, unless it is protected by other means, such as active quantum error correction, see A. M. Steane, in *Introduction to Quantum Computation and Information*, edited by H. K. Lo, S. Popescu and T. P. Spiller (World Scientific, Singapore, 1999), at p.184, incorporated herein by reference in its entirety.

Examples of step 652 can include suppression of more general system-bath interactions by decoupling. Suppose that $|J_{ij}|>>|\Delta_i|>>|B_i^X|$, $|B_i^Y|$, $|B_i^Z|$, so that $\Delta_i \sigma_i$ and $H_{ij}$ can be turned on and off freely during which time $H_{SB}$ becomes negligible. The only effect of $H_{SB}$ then is to decohere the qubit system when it evolves freely, i.e., under $\exp(-it(H_B + H_{SB}))$.

The present invention also comprises a method for error correction via decoupling a system from the bath via multiple applications of encoded selective recoupling. According to one example of this, the system-bath interaction has a symmetry so that $$H_{SB} = \sum_i (\sigma_i^Y + \sigma_i^Z) B_i^{YZ} + \sigma_i^X B_i^X$$

where i is the index of a logical qubit. In the present example $B=H_{SB}$ for step 651 of process 650 in FIG. 6. In step 652, by the application of the process described in FIG. 5, the component associated with $\sigma^Y + \sigma^Z$ can be rotated to $\sigma^Y$ where $\phi=\pi/8$ and $A=\sigma^X$. This leaves a term proportional to a weighted sum of $\sigma^Y$ and $\sigma^X$ which can be eliminated in step 653. An example of step 653 is $$B = \sum_i (\sqrt{2}\sigma_i^Y B_i^{YZ} + \sigma_i^X B_i^X), \quad A = \sigma_i^Z \otimes \sigma_{i+1}^Z$$

and $\phi=\pi/2$. In some examples of process 650, steps 652 and 653 can be repeated.

The outcome of process 650 is 654 where the Hamiltonian has components H and B wherein the latter has had multiple encoded selective recoupling performed. Therefore, at step 654 with previous applications of 652 and 653 on individual qubits or many qubits in parallel the system-bath interaction can be suppressed. In this and all the previous examples of processes 650 the pulses A have not used the short-time approximation contrary to the "encoded Bang Bang" methods described hereinbelow. As in the above example of process 650, those logical operations that commute with the recoupling pulses can be turned on simultaneously with the latter, while those that anticommute cannot.

In the case where symmetry does not exist, the error correction is still possible in accordance with aspects of the present invention. An embodiment of encoded error correction includes "encoded Bang Bang" methods which can include the use of the short-time approximation. This method includes the use of pulses, such as recoupling pulses, which are strong. The cases $$H_{SB}^{XY} = \sum_i (\sigma_i^X + \sigma_i^Y) B_i^{XY} + \sigma_i^Z B_i^Z \text{ and } H_{SB}^{ZX} = \sum_i (\sigma_i^Z + \sigma_i^X) B_i^{ZX} + \sigma_i^Y B_i^Y$$

cannot be eliminated using decoupling methods and the available interactions of the given embodiments of a quantum computer. However, other quantum registers with other recoupling pulses may be able to eliminate system bath interaction of the form of the above two cases. For a quantum register, an encoded Bang Bang method can be used to eliminate system bath interactions of are arbitrary form.

Higher Encoding Rate Designs

As discussed hereinabove, the present invention can be practiced on registers with complex topologies, including physical layouts with more complicated repeating patterns, and encoding schemes of higher encoding rate. The "encoding rate" is defined as the number of logical qubits divided by the number of physical qubits, needed for their encoding. For example, the encoding rate of the register in FIG. 2C is 0.5. An embodiment of the present invention has an architecture that uses 3 physical qubits to encode 2 logical qubits, and therefore has an encoding rate of 0.67.

Figure 7A:
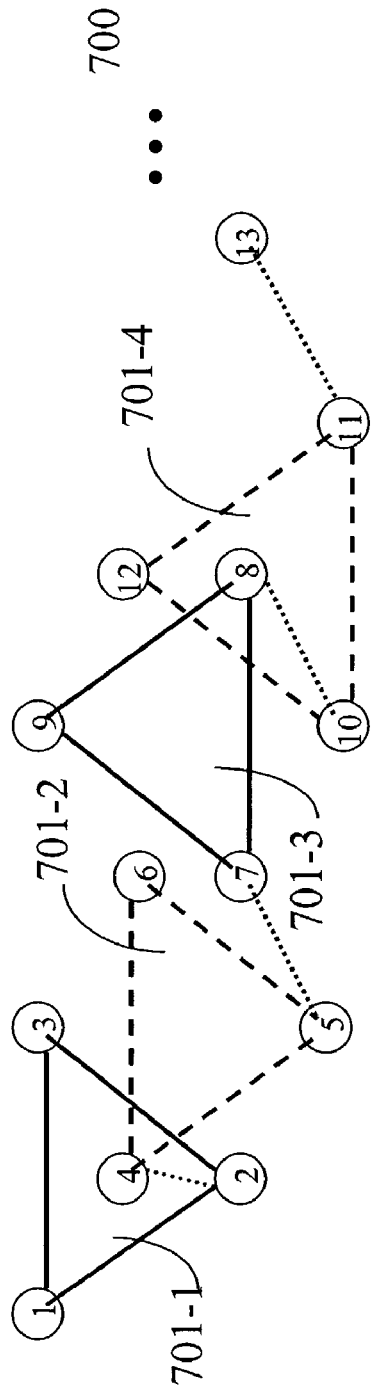

FIG. 7A illustrates an embodiment with an encoding rate greater than 0.5, and a complex topology. A basic building block of this embodiment includes a pair of logical qubits, formed from two operating qubits, 1 and 3, biased by a single ancilla qubit 2. Couplings between physical qubits 1,2,3 are shown by solid lines. These triangular logical qubit pairs can be placed in a one dimensional array, as illustrated by the sequence of triangles 1,2,3; 7,8,9; etc. The dimensionality of layouts of the present invention include but are not limited to, 2 and 3-dimensional arrays. A second array of triangular logical qubit pairs can be formed, indexed as 4,5,6; 10,11,12; etc., coupled by the dashed lines in FIG. 7A. This second array can be formed in a second layer, superimposed over (or under) the first array. The first qubits in the first array can be coupled to qubits in the second array. Thus, the qubits from the first and second arrays are linked together to form a chain. A complex topology is formed by the fact that the unit cell of a repeating pattern contains two triangles, for instance, the triangles with vertices (qubits) 1,2,3; and 4,5,6. The second triangle for the unit cell (4,5,6) can be seen as forming in a second layer, creating a sense of higher dimensionality for the topology. It is possible to regard the physical qubits 1,2,3,4 as forming a tetrahedron, as do the physical qubits 3,6,7,9; 8,10,11,12. The physical qubits have nearest neighbor couplings of the type $\sigma_1^Z \sigma_2^Z$, $\sigma_2^Z \sigma_3^Z$, which provide switchable operating, and phase-flip couplings. The tetrahedrons are coupled, as shown, by the short-dashed lines between qubits 2 and 4; and between qubits 5 and 7; etc.

Formally, the encoding scheme for embodiments of qubit encodings with higher rate is:

$$|0\rangle_L|0\rangle_L = |0_i 0_{i+1} 0_{i+2}\rangle \quad (20a)$$

$$|0\rangle_L|1\rangle_L = |0_i 1_{i+1} 0_{i+2}\rangle \quad (20b)$$

$$|1\rangle_L|0\rangle_L = |1_i 0_{i+1} 0_{i+2}\rangle \quad (20c)$$

$$|1\rangle_L|1\rangle_L = |1_i 1_{i+1} 0_{i+2}\rangle \quad (20d)$$

The two logical qubits are encoded by 3 adjacent physical qubits, an arrangement which has the encoding rate 0.67. The encoded operations for this scheme are similar to the embodiment described hereinabove, with an encoding rate of 0.5. A typical embodiment of the encoded $\sigma^X$ operations is tunneling between the two quantum states of the physical qubits, formally defined as $X_i = \sigma_i^X$. A typical embodiment of the biasing of the operating qubits is provided through a Josephson coupling of the type $\sigma^Z \sigma^Z$ between an ancilla qubit and an operating qubit. A typical embodiment of the two qubit operations, or encoded $\sigma^Z \sigma^Z$ operations are Josephson couplings between nearest neighbors.

In alternative embodiments, the triangles of FIG. 7A can be arranged in other different layouts, for example, in a single layer, or with the triangles oriented in an alternating manner, or oriented in a repetitive manner.

Figure 7B:
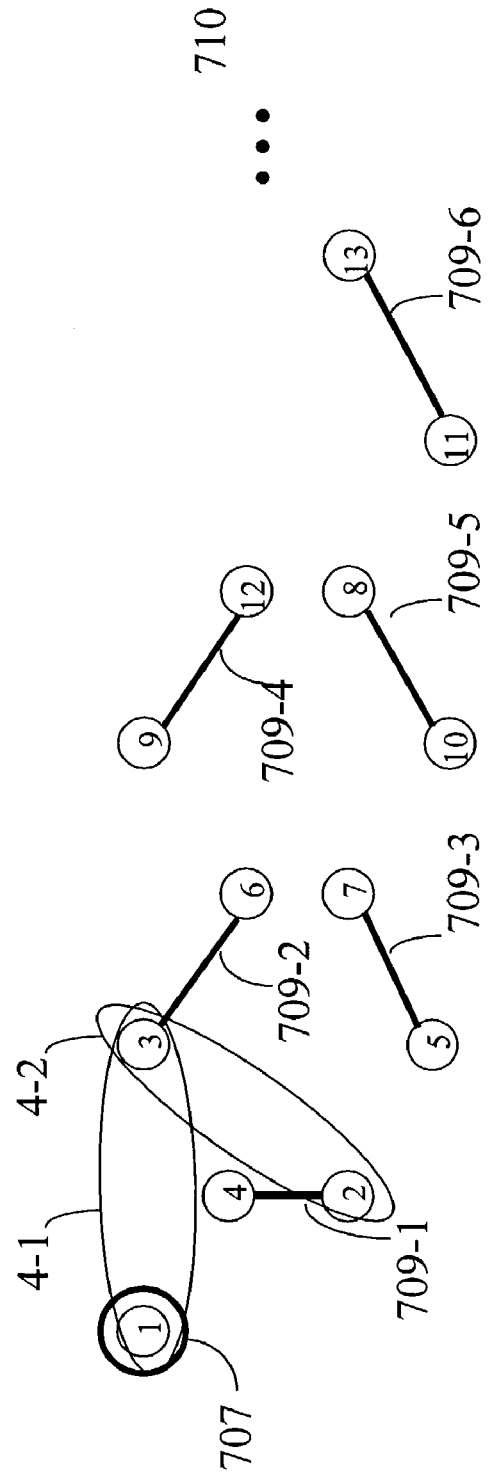

FIG. 7B illustrates a coupling scheme of an encoded $\sigma^X$ operation, 710, on logical qubit 4-1. During this operation, the tunneling term is activated for operating qubit 1, hence operating qubit 1 is allowed to undergo free tunneling, 707. The tunneling term is activated, for example, by switching off the Josephson couplings of operating qubit 1, thereby bringing its two quantum states substantially in resonance.

During the encoded $\sigma^X$ operation, the other qubits can have an unwanted time evolution. This unwanted time evolution is compensated by refocusing the quantum states of the other physical qubits, for example, in pairs, 709-1 through 709-N. In this embodiment, the physical qubits indexed as a multiple of 3 (i.e., 3, 6, 9 etc.) are paired up with another such indexed qubit. The physical qubits with an index of the multiple of 3 are collectively called bus qubits. In some of the operations, the operating qubits and the ancilla qubits play a substantially interchangeable role, hence they can all be referred to by one term, as physical qubits.

FIG. 7C illustrates a coupling scheme for single qubit biasing, or encoded $\sigma^Z$ operation, 720, on logical qubit 4-1. For the encoded $\sigma^Z$ operation, physical qubit 1 is coupled to physical qubit 3, by switching on switchable coupling 708. The unwanted time evolution of the other qubits is once again compensated by refocusing the quantum states of the other physical qubits in pairs, 709-1 through 709-N. The pairs of qubits, 709-1-709-N form "bus qubits."

Equivalently, the coupling scheme of an encoded $\sigma^Z$ operation on logical qubit 4-2 can be achieved by coupling physical qubit 2 to physical qubit 3. The other physical qubits are refocused in pairs 709-1 through 709-N.

FIG. 7D illustrates a coupling scheme for logical two qubit interactions such as $\sigma_1^Z \sigma_2^Z$, 728, on logical qubits 4-1 and 4-2. For the encoded $\sigma_1^Z \sigma_2^Z$ operation, 728, physical qubit 1 is coupled to physical qubit 2 by switching on the switchable coupling in between. The unwanted time evolution of the other qubits is compensated by refocusing the quantum states of the other physical qubits in pairs, 709-1 through 709-N.

Equivalently, the coupling scheme of an encoded $\sigma_2^Z \sigma_3^Z$ operation on logical qubits 4-2 and 4-3 in FIG. 7D involves coupling physical qubit 2 to physical qubit 3. The other physical qubits are refocused in pairs 709-1 through 709-N.

Figure 7E:
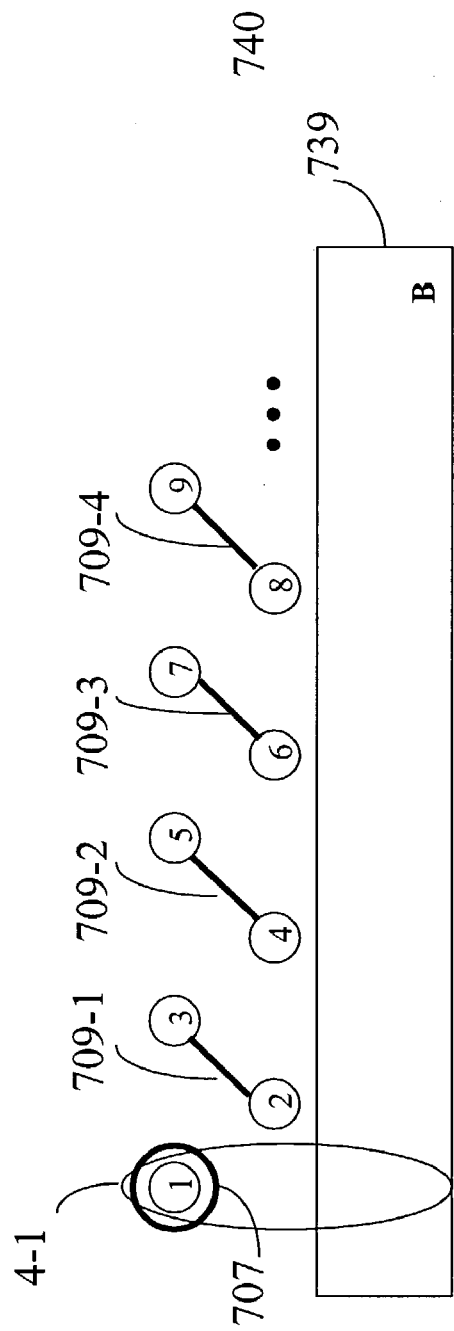

FIG. 7E illustrates a further embodiment of the invention. The ovals in FIG. 7E indicate the equivalents of the triangularly arranged physical qubits of the previous embodiments. As mentioned above every third qubit in this physical layout is called a bus qubit. Pairs of logical qubits are now formed by physical qubits 1,2, and the bus; physical qubits 3, 4, and the bus; etc. Furthermore, in equation 15, the bus qubit is in the quantum state $|0\rangle$. Therefore, the bus qubits 3, 6, 9, etc. can be interchanged for a bus qubit, 739. The bus is either frozen in the $|0\rangle$ state, or refocused when necessary. As indexing is arbitrary here, for convenience, the qubits are reindexed.

FIG. 7E further illustrates the coupling scheme of an encoded $\sigma^X$ operation on logical qubit 4-1, 707. During this operation, the tunneling term is activated for operating qubit 1, hence operating qubit 1 is allowed to undergo free tunneling, 707. The tunneling term is activated, for example, by switching off the Josephson couplings of operating qubit 1, bringing its two quantum states substantially in resonance. During an encoded $\sigma^X$ operation, the other qubits can have an unwanted time evolution. This unwanted time evolution can be compensated by refocusing the quantum states of the other physical qubits, for example, in pairs, 709-1 through 709-N.

Figure 7F:
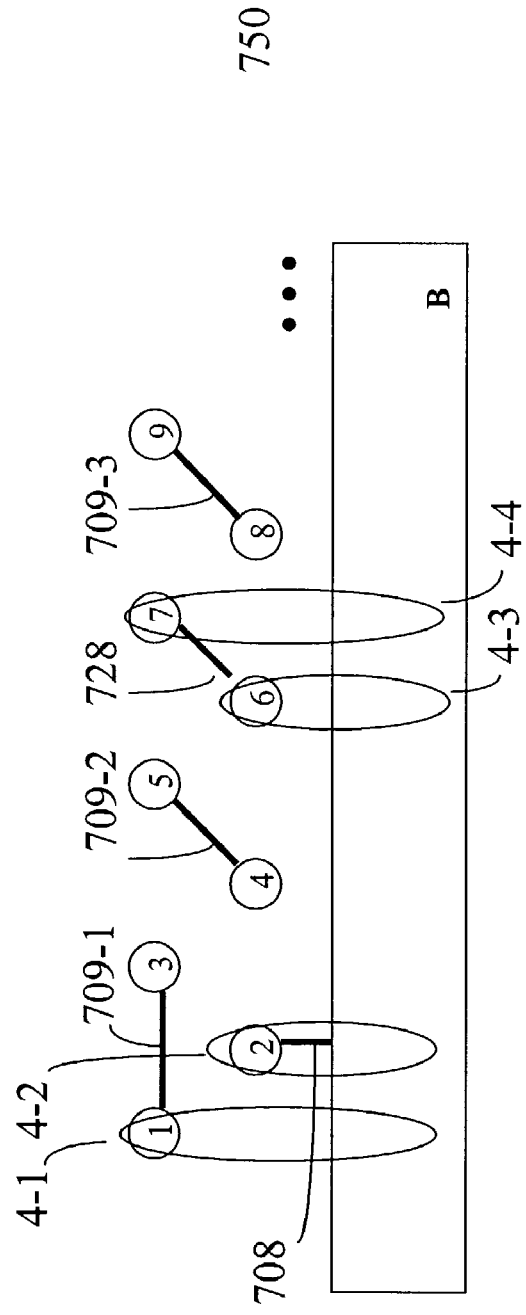

FIG. 7F illustrates the coupling scheme of an encoded $\sigma^Z$ operation on logical qubit 4-2 by coupling physical qubit 2 to bus 739 by switching on switchable coupling 708. Once again, unwanted time evolution can be compensated by refocusing the quantum states of the other physical qubits, possibly in pairs 709-1 through 709-N.

FIG. 7F also illustrates the coupling scheme of an encoded two qubit operation on logical qubits 4-3 and 4-4 where the switchable couplings between physical qubits 6 and 7 are switched on. Once again, unwanted time evolution can be compensated by refocusing the other physical qubits in pairs 709-1 through 709-N. Physical qubits can also be refocused using the bus.

Implementation Bases on Other Qubits

Embodiments of the present invention include encoding schemes for qubits and registers other than register 100 of FIG. 1. Embodiments of the present invention also include encoding schemes for phase qubits that comprise a loop of superconducting material interrupted by a plurality of Josephson junctions. Examples include the persistent current qubit, the "quiet qubit", and the multi-terminal Josephson junction qubit. See, e.g., respectively, J. E. Mooij, T. P. Orlando, L. Levitov, L. Tian, C. H. van der Wal, and S. Lloyd, "Josephson persistent-current qubit", Science, Vol. 285, p. 1036 (1999); G. Blatter, V. B. Geshkenbein, and L. V. Ioffe, Physical Review B, Vol. 63, 174511, (2001); and U.S. patent application Ser. No. 09/839,637 entitled "Quantum Bit with a Multi-Terminal Junction and Loop with a Phase Shift," filed Apr. 20, 2001, each of which is incorporated herein by reference in its entirety. Other examples may be found in Y. Makhlin, G. Schön, and A. Shnirman, "Quantum-State Engineering with Josephson-Junction Devices", *Reviews of Modern Physics*, Vol. 73, p. 357 (2001), previously incorporated by reference.

FIG. 8A illustrates a 4 Josephson junction persistent current qubit that is well known the art. The Josephson junctions 813-1 through 813-4 are constructed with different Josephson energy. This 4 junction persistent current qubit 810 includes a large loop 808 and a small loop 809. According to methods of the present invention, currents $I_Z$ and $I_X$ provide a controlling flux in large loop 808 and small loop 809 respectively, and are used to control single-qubit operations, $\sigma^Z$ and $\sigma^X$, respectively. The 4 junction persistent current qubit can couple to another qubit through an inductive coupling 815-1.

FIG. 8B illustrates a modification of 810 that creates an encoded logical qubit that is absent of individual qubit bias, as shown by the coupled physical qubits 4 of FIG. 2A. Two persistent current qubits, each with 3 Josephson junctions, that are well known in the art, are coupled to produce an embodiment of a logical qubit. The coupling corresponding to switchable coupling 3 of FIG. 2A is provided by the loop 815-2 with optional switch 816. This logical qubit 820 can be operated in a universal fashion, including the application of such operations as $X_i$, $Z_i$ and $Z_iZ_j$ along with recoupling and encoded error correction. This logical qubit does not require individual qubit operations, for example bias, to be universal. The removal of the flux controlling the single-qubit operations removes a source of noise from the system.

FIG. 8C illustrates the "quiet qubit" design known in the art. The a Josephson junction with a tuned phase shift 860-1 gives rise to a two-level system. Single qubit operations are implemented by voltage pulses on the switches 853-1 and 853-2. Coupling to other qubits is not shown. In accordance with an aspect of the present invention the single qubit operations are slow and difficult to implement. Therefore as illustrated in FIG. 8D the phase shifted Josephson junction 860-2 is connected to another phase shifted Josephson junction 860-3. Only a switchable coupling 853-3 is retained to obtain one logical qubit. The physical qubits are coupled, providing an additional embodiment of element 4 of FIG. 2A. Further, the physical qubits provide the necessary two-qubit logical gates to retain universality. These couplings can be arranged to provide a term in the Hamiltonian which has the same symmetry as described hereinabove i.e.,

What is claimed:

1. A quantum computing structure, comprising:
   one or more logical qubits, wherein:
   each of the logical qubits is encoded into a plurality of superconducting qubits;
   each of the logical qubits comprises at least one operating qubit and at least one ancilla qubit wherein each logical qubit in the one or more logical qubits comprises and ancilla qubit that is in a predetermined basis state during quantum computation;
   each of the logical qubits has two logical states; and
   a logical state of a logical qubit in said one or more logical qubits comprises a tensor product of a quantum state of the operating qubit and a quantum state of the ancilla qubit of the logical qubit.

2. The quantum computing structure of claim 1, wherein a universal set of logic operations is supported by the logical qubits.

3. The quantum computing structure of claim 2, wherein the universal set of logic operations comprises single logical qubit operations, and at least one two logical qubit operation.

4. The quantum computing structure of claim 3, wherein a single logical qubit operation is a logical bit-flip operation or a logical phase-flip operation.

5. The quantum computing structure of claim 1, wherein the logical qubit is capable of being in a superposition of the two logical states.

6. The quantum computing structure of claim 3, wherein the one or more logical qubits comprise a plurality of logical qubits and at least one two logical qubit operation comprises a controlled phase operation between a pair of logical qubits in the plurality of logical qubits.

7. The quantum computing structure of claim 3, wherein the one or more logical qubits comprise a plurality of logical qubits and at least one two logical qubit operation comprises a controlled phase operation between a pair of logical qubits in the plurality of logical qubits.

8. The quantum computing structure of claim 1, wherein the dynamics of an ancilla qubit in the at least one ancilla qubit are partially suppressed.

9. The quantum computing structure of claim 1, wherein an ancilla qubit in the at least one ancilla qubit is coupled to an operating qubit so that a logical phase-flip operation can be carried out.

10. The quantum computing structure of claim 1, wherein an ancilla qubit in the at least one ancilla qubit is coupled to an operating qubit with a switchable coupling.

11. The quantum computing structure of claim 10, wherein the switchable coupling is a controlled phase coupling.

12. The quantum computing structure of claim 1, wherein the one or more logical qubits comprise a plurality of logical qubits and wherein a first logical qubit is coupled to a second logical qubit in the plurality of logical qubits by one or more switchable logical couplings.

13. The quantum computing structure of claim 12, wherein an operating qubit in the first logical qubit is coupled to an operating qubit in the second logical qubit by a switchable operating coupling.

14. The quantum computing structure of claim 12, wherein an ancilla qubit in the first logical qubit is coupled to an ancilla qubit in the second logical qubit by a switchable ancilla coupling.

15. The quantum computing structure of claim 1, wherein the one or more logical qubits comprise a plurality of logical qubits and more than one logical qubit in the plurality of logical qubits shares a single ancilla qubit.

16. The quantum computing structure of claim 1, wherein the plurality of superconducting qubits in each logical qubit in the one or more logical qubits are phase qubits.

17. The quantum computing structure of claim 16, wherein the one or more logical qubits comprise a plurality of logical qubits and the operating qubits in the plurality of logical qubits collectively comprise:
   a first superconducting bank;
   a first plurality of mesoscopic superconducting islands, wherein at least one of the superconducting islands in the first plurality of mesoscopic superconducting islands and the first superconducting bank comprise an unconventional superconducting material; and
   a first plurality of Josephson junctions coupling between the first plurality of superconducting islands and the first superconducting bank.

18. The quantum computing structure of claim 17, wherein the first superconducting bank includes a plurality of first fingers, each of which is connected to one of the first plurality of Josephson junctions.

19. The quantum computing structure of claim 18, wherein the ancilla qubits in the plurality of logical qubits collectively comprise:
   a second superconducting bank;
   a second plurality of mesoscopic superconducting islands, wherein at least one of the second superconducting islands in the second plurality of mesoscopic superconducting islands and the second superconducting bank comprises an unconventional superconducting material; and
   a second plurality of Josephson junctions coupling between the second plurality of superconducting islands and the second superconducting bank.

20. The quantum computing structure of claim 19, wherein an ancilla qubit in the plurality of qubits includes a quiet qubit.

21. The quantum computing structure of claim 19, wherein the second superconducting bank includes a plurality of second fingers, each of which is connected to one of the second plurality of Josephson junctions.

22. The quantum computing structure of claim 21, wherein:
the first and second quantum states of an operating qubit in the plurality of logical qubits correspond to a first and a second phase difference across one of the first plurality of Josephson junctions; and
the first and second quantum states of the ancilla qubit in the plurality of logical qubits correspond to a first and a second phase difference across one of the second plurality of Josephson junctions.

23. The quantum computing structure of claim 16, wherein the ancilla qubits and the operating qubits in the plurality of logical qubits collectively form a linked chain of triangles, wherein:
one or more ancilla qubits are each coupled to two operating qubits by switchable controlled phase couplings;
one or more operating qubits are each coupled to two ancilla qubits by switchable controlled phase couplings;
one or more pairs of neighboring operating qubits are coupled by switchable operating couplings; and
one or more pairs of neighboring ancilla qubits are coupled by switchable ancilla couplings.

24. The quantum computing structure of claim 23, wherein a switchable controlled phase coupling or a switchable operating coupling comprises a switchable Josephson coupling.

25. The quantum computing structure of claim 23, wherein a switchable controlled phase coupling or a switchable operating coupling comprises a single Cooper pair transistor.

26. The quantum computing structure of claim 25, wherein the single Cooper pair transistor comprises at least one of:
a mesoscopic transistor island;
an operating capacitive coupling, coupling the transistor island to the operating qubit;
an ancilla capacitive coupling, coupling the transistor island to the ancilla qubit; and
a gate capacitive coupling, capable of switching the transistor island from conducting to insulating by tuning a gate voltage.

27. The quantum computing structure of claim 26, wherein the size of the mesoscopic transistor island is less than the inelastic scattering length of the Cooper pairs of the single Cooper pair transistor.

28. The quantum computing structure of claim 16, wherein an operating qubit in a logical qubit includes a loop of superconducting material containing a plurality of Josephson junctions.

29. The quantum computing structure of claim 28, wherein the operating qubit includes a persistent current qubit.

30. The quantum computing structure of claim 16, wherein an ancilla qubit in a logical qubit includes a loop of superconducting material containing a plurality of Josephson junctions.

31. The quantum computing structure of claim 30, wherein the ancilla qubit includes a persistent current qubit.

32. The quantum computing structure of claim 16, wherein an operating qubit includes a quiet qubit.

33. The quantum computing structure of claim 1, wherein the plurality of superconducting qubits are charge qubits.

34. The quantum computing structure of claim 1, wherein an ancilla qubit in the at least one ancilla qubit in a logical qubit in the one or more logical qubits includes a charge qubit.

35. The quantum computing structure of claim 1, wherein an operating qubit in the at least one operating qubit in a logical qubit in the one or more logical qubits includes a charge qubit.

36. The quantum computing structure of claim 1, wherein the predetermined basis state is the $|1\rangle$ basis state.

37. The quantum computing structure of claim 1, wherein at least one logical qubit in the one or more logical qubits is formed from two operating qubits and one ancilla qubit.

38. The quantum computing structure of claim 37, wherein the operating qubits and the ancilla qubits have a complex topology.

39. The quantum computing structure of claim 38, wherein the logical qubits are arranged in at least two arrays of triangles.

40. A quantum computing structure, comprising:
one or more logical qubits; wherein:
each of the logical qubits is encoded into a plurality of superconducting qubits;
each of the logical qubits comprises at least one operating qubit and at least one ancilla qubit wherein each logical qubit in the one or more logical qubits comprises an ancilla qubit that is in a predetermined basis state during quantum computation, wherein the ancilla qubits in the one or more logical qubits form a superconducting bus;
a superconducting bank;
a plurality of mesoscopic superconducting islands, wherein at least one of the superconducting islands and the superconducting bank comprise an unconventional superconducting material; and
a plurality of Josephson junctions coupling between the plurality of superconducting islands and the superconducting bank.

41. The quantum computing structure of claim 40, wherein the superconducting bus is coupled to the operating qubits by one or more switchable phase-flip couplings.

42. The quantum computing structure of claim 41, wherein a switchable phase-flip coupling in the one or more switchable phase-flip couplings is a Josephson coupling.

43. The quantum computing structure of claim 42, wherein the Josephson coupling comprises a single Cooper pair transistor.

44. The quantum computing structure of claim 40, wherein the superconducting bus includes an unconventional superconducting material.

45. The quantum computing structure of claim 40, wherein the superconducting bank forms a polygon.

46. The quantum computing structure of claim 45, wherein the superconducting bus is positioned inside the polygon.

47. A quantum computing structure, comprising:
one or more logical qubits, wherein the one or more logical qubits are encoded into a plurality of superconducting qubits, wherein the plurality of superconducting qubits are phase qubits, and wherein the one or more logical qubits comprise superconducting operating qubits and superconducting ancilla qubits, wherein operating qubits comprise:
a first superconducting bank including a plurality of first fingers, coupled to the first Josephson junctions;
a first plurality of mesoscopic superconducting islands, wherein at least one of the first superconducting islands and the first superconducting bank comprise an unconventional superconducting material; and
a first plurality of Josephson junctions between the first plurality of superconducting islands and the first superconducting bank; and
ancilla qubits comprise:
a second superconducting bank including a plurality of second fingers, coupled to the second Josephson junctions;
a second plurality of mesoscopic superconducting islands, wherein at least one of the second superconducting islands and the second superconducting bank comprise an unconventional superconductor; and
a second plurality of Josephson junctions between the second plurality of superconducting islands and the second superconducting bank.

* * * * *